United States Patent
Kitada

(10) Patent No.: US 10,734,948 B2
(45) Date of Patent: Aug. 4, 2020

(54) CRYSTAL UNIT

(71) Applicant: KYOCERA Corporation, Kyoto-shi, Kyoto (JP)

(72) Inventor: Masanobu Kitada, Kyoto (JP)

(73) Assignee: KYOCERA Corporation, Kyoto-Shi, Kyoto (JP)

( * ) Notice: Subject to any disclaimer, the term of this patent is extended or adjusted under 35 U.S.C. 154(b) by 0 days.

(21) Appl. No.: 16/147,929

(22) Filed: Oct. 1, 2018

(65) Prior Publication Data

US 2019/0103836 A1 Apr. 4, 2019

(30) Foreign Application Priority Data

Oct. 2, 2017 (JP) .................. 2017-192543

(51) Int. Cl.
| *H03B 5/04* | (2006.01) |
| *H01L 41/047* | (2006.01) |
| *H01L 41/053* | (2006.01) |
| *H03B 5/32* | (2006.01) |
| *H01L 25/16* | (2006.01) |
| *H01L 41/09* | (2006.01) |
| *H01L 29/66* | (2006.01) |
| *H01L 41/332* | (2013.01) |
| *H01L 29/861* | (2006.01) |

(52) U.S. Cl.
CPC ............ *H03B 5/04* (2013.01); *H01L 25/165* (2013.01); *H01L 41/0477* (2013.01); *H01L 41/0533* (2013.01); *H01L 41/094* (2013.01); *H03B 5/32* (2013.01); *H01L 29/66128* (2013.01); *H01L 29/66136* (2013.01); *H01L 29/861* (2013.01); *H01L 29/8611* (2013.01); *H01L 41/332* (2013.01); *H03B 2200/0018* (2013.01)

(58) Field of Classification Search
CPC .... H03B 5/04; H03B 5/35; H03B 2200/0018; H01L 41/094; H01L 25/165
See application file for complete search history.

(56) References Cited

U.S. PATENT DOCUMENTS

| 5,821,599 A * | 10/1998 | Rupp .................. G01K 7/01 257/467 |
| 2003/0020564 A1* | 1/2003 | Nishimura ........... H03H 9/0207 333/187 |
| 2008/0087918 A1* | 4/2008 | Arendt ............... H01L 29/0692 257/197 |
| 2013/0009521 A1* | 1/2013 | Nakanishi ............ H03H 9/1021 310/365 |
| 2016/0197594 A1* | 7/2016 | Hanzawa .............. H01C 7/008 310/348 |
| 2018/0212585 A1* | 7/2018 | Yamamoto ............. H03H 9/19 |

FOREIGN PATENT DOCUMENTS

JP 2014-086937 A 5/2014

* cited by examiner

*Primary Examiner* — Jeffery M Shin
(74) *Attorney, Agent, or Firm* — Volpe and Koenig, P.C.

(57) ABSTRACT

A crystal unit includes a package, a crystal element, and a temperature sensor. The crystal element includes a crystal blank and a pair of excitation electrodes on a pair of major surfaces of the crystal blank and is air-tightly sealed in the package. The temperature sensor is mounted in the package. The crystal blank includes a crystal plane inclined relative to the major surfaces in at least a portion of the side surfaces.

10 Claims, 13 Drawing Sheets

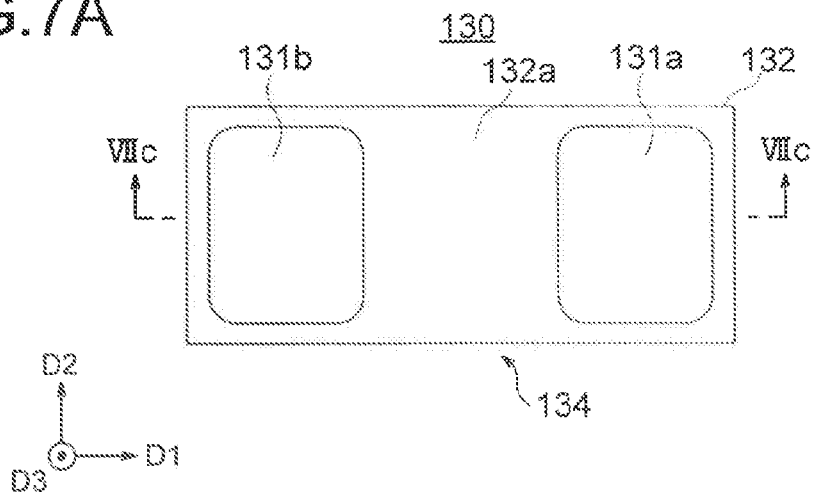
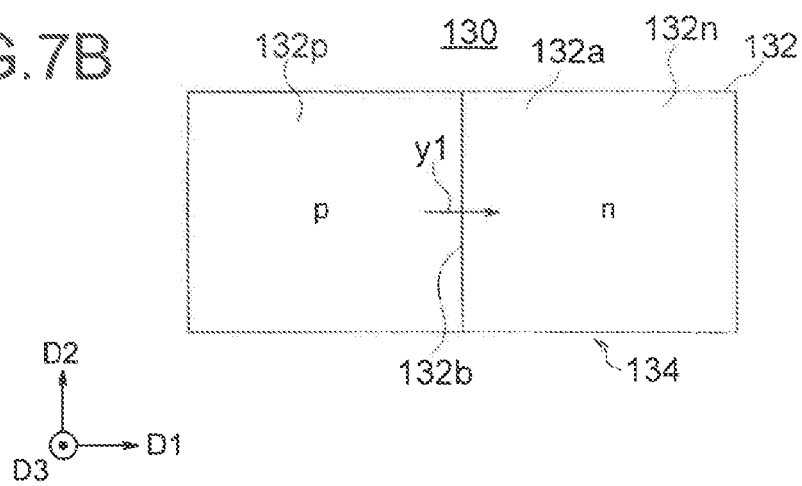
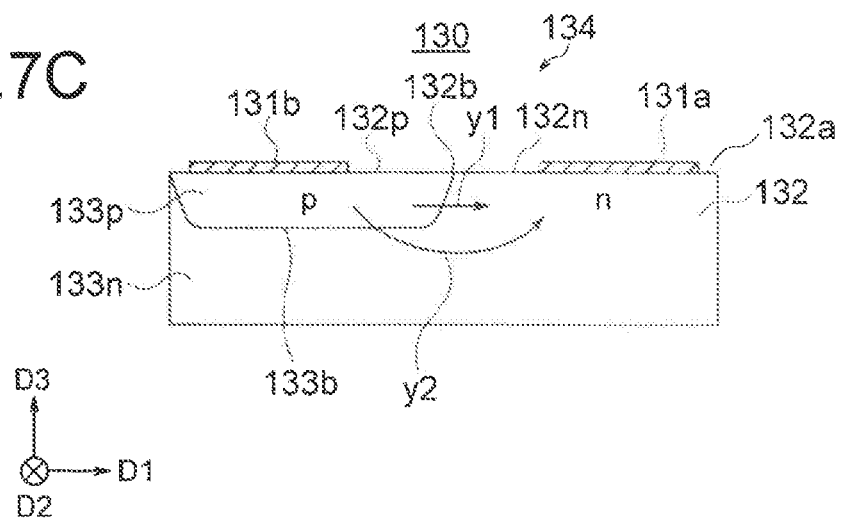

US 10,734,948 B2

CRYSTAL UNIT

TECHNICAL FIELD

The present disclosure relates to a crystal unit utilized for an oscillator or the like.

BACKGROUND ART

Known in the art is a crystal unit having a crystal element and a temperature sensor (for example Patent Literature 1). The crystal element has for example a crystal blank and a pair of excitation electrodes provided on a pair of major surfaces of the crystal blank. This is excited by application of voltage and is utilized for generation of an oscillation signal having a constant frequency. Further, the detection value of the temperature sensor is for example utilized for a temperature compensation circuit which compensates for a change of characteristic of the crystal element due to a temperature change. The crystal blank in Patent Literature 1 is formed by a beveling or other machining.

CITATION LIST

Patent Literature

Patent Literature 1: Japanese Patent Publication No. 2014-86937A

SUMMARY OF INVENTION

Solution to Problem

A crystal unit according to one aspect of the present disclosure includes a package, a crystal element, and a temperature sensor. The crystal element includes a crystal blank and a pair of excitation electrodes positioned on a pair of major surfaces of the crystal blank and is air-tightly sealed in the package. The temperature sensor is mounted in the package. The crystal blank includes a crystal plane inclined relative to the major surfaces in at least a portion of the side surfaces.

BRIEF DESCRIPTION OF DRAWINGS

FIG. 4A is a plan view showing a package of the crystal unit in FIG. 1 from the top surface, while

FIG. 5A is a plan view showing the substrate part in FIG. 4B from the bottom surface, while

FIG. 7A is a plan view showing an outer appearance of a temperature sensor, FIG. 7B is a plan view showing the configuration of a semiconductor substrate of the temperature sensor in FIG. 7A, and FIG. 7C is a cross-sectional view taken along the VIIc-VIIc line in FIG. 7A.

DESCRIPTION OF EMBODIMENTS

Figure 1:
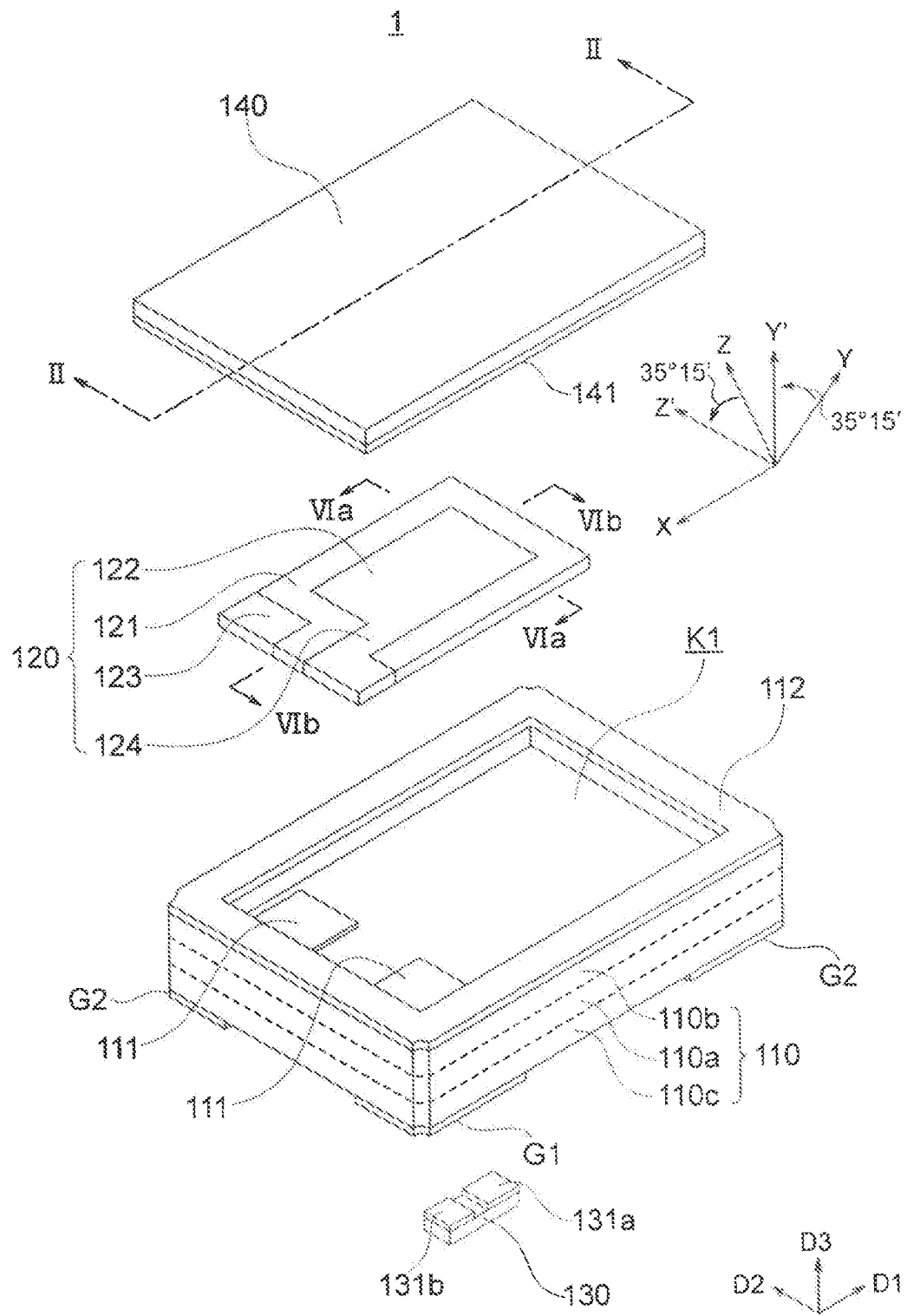
FIG. 1 A disassembled perspective view showing the configuration of a crystal unit according to a first embodiment.

Below, embodiments according to the present disclosure will be explained with reference to the drawings. Note that, in the drawings, for convenience, sometimes an orthogonal coordinate system comprised of a D1 axis, D2 axis, and D3 axis will be attached. In the crystal unit according to the embodiment, any direction may be used as the "above" or "below" as well. However, in the following description, for convenience, sometimes use will be made of "upper surface", "lower surface", or other terms where the positive side of the D3 axis is defined as the "above" or the upper part on the drawing sheet for the figure which is explained at present is defined as the "upper part".

In the explanation of the second embodiment and on, for the configurations which are common with or similar to the configurations of the previously explained embodiments, sometimes use will be made of notations attached to the configurations of the previously explained embodiments and illustrations and explanations will be omitted. Note that, in the configurations corresponding (similar) to the configurations of the previously explained embodiments, even in a case where notations different from those of the configurations of the previously explained embodiments are attached, points which are not particularly explained may be regarded as the same as the configurations of the previously explained embodiments.

First Embodiment

Figure 2:
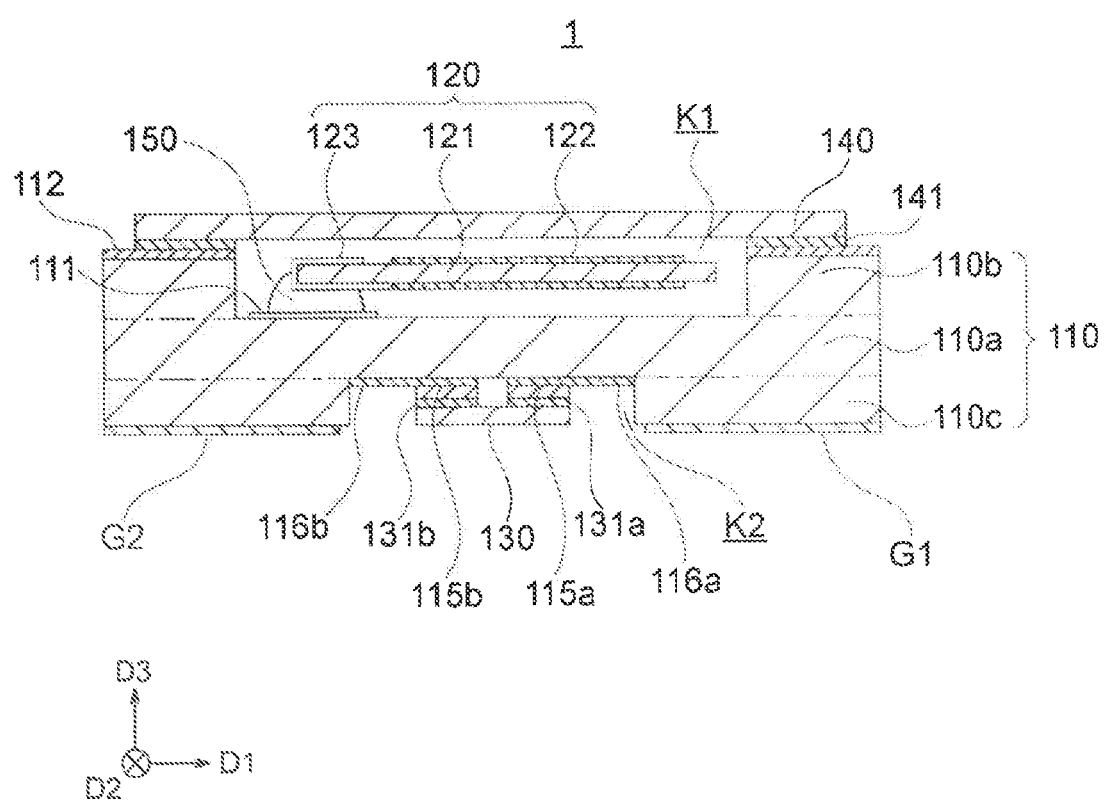
FIG. 2 A cross-sectional view taken along a II-II line in FIG. 1.
Figure 3:
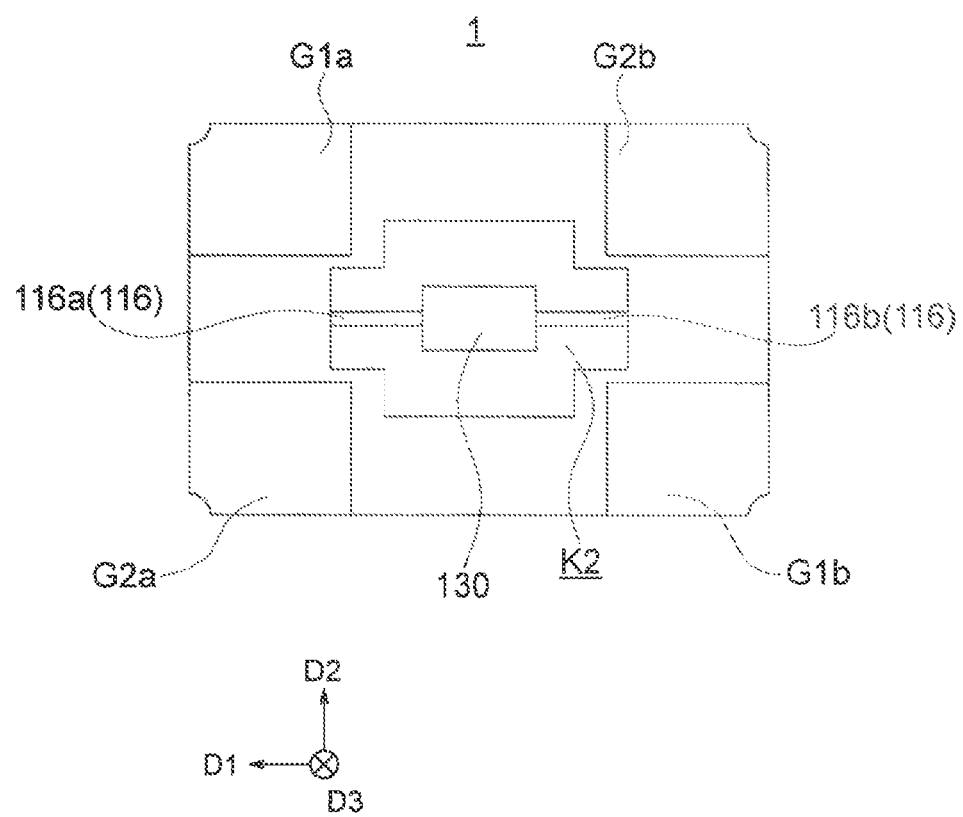
FIG. 3 A plan view showing the crystal unit in FIG. 1 from the bottom surface side.

A crystal unit 1 in the present embodiment, as shown in FIG. 1 to FIG. 3, includes a package 110, a crystal element 120 joined to an upper surface of the package 110, and a temperature sensor 130 joined to a lower surface of the package 110. In the package 110, a first concave part K1 surrounded by an upper surface of a substrate part 110a and inner side surfaces of a first frame 110b is formed. Further, in the package 110, a second concave part K2 surrounded by a lower surface of the substrate part 110a and inner side surfaces of a second frame 110c is formed. The first concave part K1 is air-tightly sealed by a lid 140.

(Package)

The substrate part 110a is a rectangular shape and functions as a support member for supporting the crystal element 120 mounted on the upper surface and the temperature sensor 130 mounted on the lower surface. On the upper surface of the substrate part 110a, electrode pads 111 for bonding the crystal element 120 are provided. On the lower surface of the substrate part 110a, bonding pads 115 (115a, 115b) for bonding the temperature sensor 130 are provided.

The substrate part 110a is comprised of an insulation layer of for example alumina ceramic or glass ceramic or another ceramic material. The substrate part 110a may be one using one insulation layer or one formed by stacking a plurality of insulation layers as well. On the surface and in the internal portion of the substrate part 110a, provision is made of crystal element-use wiring patterns 113 and first via conductors 114 for electrically connecting the electrode pads 111 provided on the upper surface and first external connection-use electrode terminals G1 provided on the lower surface of the second frame 110c (FIG. 4). Further, on the surface and in the internal portion of the substrate part 110a, provision is made of sensor-use wiring patterns 116 and second via conductors 117 for electrically connecting the bonding pads 115 provided on the lower surface and second external connection-use electrode terminals G2 provided on the lower surface of the second frame 110c (FIG. 5).

The first frame 110b is arranged on the upper surface of the substrate part 110a and forms the first concave part K1 on the upper surface of the substrate part 110a. The second frame 110c is arranged on the lower surface of the substrate part 110a and forms the second concave part K2 on the lower surface of the substrate part 110a. The first frame 110b and second frame 110c are made of for example alumina ceramic or glass ceramic or another ceramic material and are formed integrally with the substrate part 110a.

In contrast to the first concave part K1 being air-tightly sealed by the lid 140, the second concave part K2 is opened to the external portion. That is, the second concave part K2 is not closed by a lid and is not filled with a sealing resin either. However, the second concave part K2 may be air-tightly sealed by filling a resin as well unlike the example shown. The second concave part K2 may be air-tightly sealed by sealing the crystal unit 1 by a resin after mounting the crystal unit 1 on a not shown circuit board or need not be air-tightly sealed in this way.

The dimensions of the parts of the package 110 may be suitably set. For example, the thickness of the second frame 110c is thinner than the total thickness of the substrate part 110a and first frame 110b. Naturally, the former may be equal to or thicker than the latter as well. The dimensions of the outer shape of the package, as an example, are such that the length of the long side (D1 axis direction) is 1.5 mm to 3.0 mm, the length of the short side (D2 axis direction) is 1.0 mm to 2.5 mm (however, shorter than the long side), and the thickness (D3 axis direction) is 0.4 mm to 1.5 mm (however, shorter than the short side).

Further, at the four corners of the lower surface of the second frame 110c, a pair of first external connection-use electrode terminals G1 and pair of second external connection-use electrode terminals G2 are provided. The pair of first external connection-use electrode terminals G1 are provided positioned diagonally on the lower surface of the second frame 110c. Further, the second external connection-use electrode terminals G2 are provided positioned diagonally on the second frame 110c at positions different from the diagonal positions where the first external connection-use electrode terminals Gs1 are provided.

The electrode pads 111 are used for mounting the crystal element 120. The electrode pads 111 are provided as a pair on the upper surface of the substrate part 110a and are provided adjacent to each other along one side of the substrate part 110a. The electrode pads 111, as shown in FIGS. 4A and 4B and FIGS. 5A and 5B, are electrically connected with the first external connection-use electrode terminals G1 provided on the lower surface of the second frame 110c through crystal element-use wiring patterns 113 provided on the upper surface of the substrate part 110a and first via conductors 114 provided in the substrate part 110a and second frame 110c.

Figure 4A:
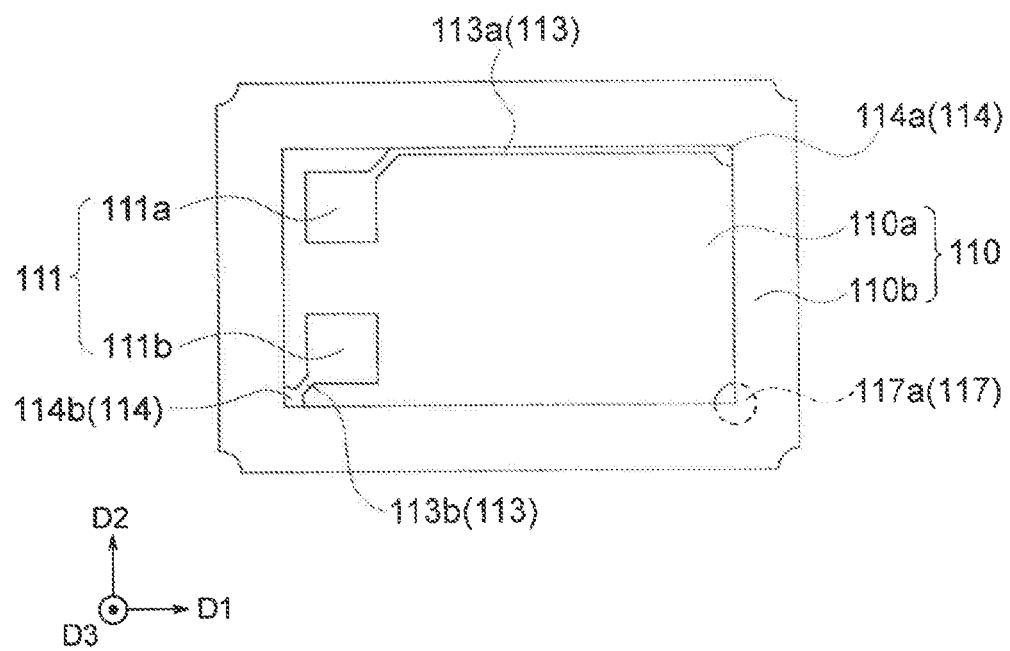
Figure 4B:
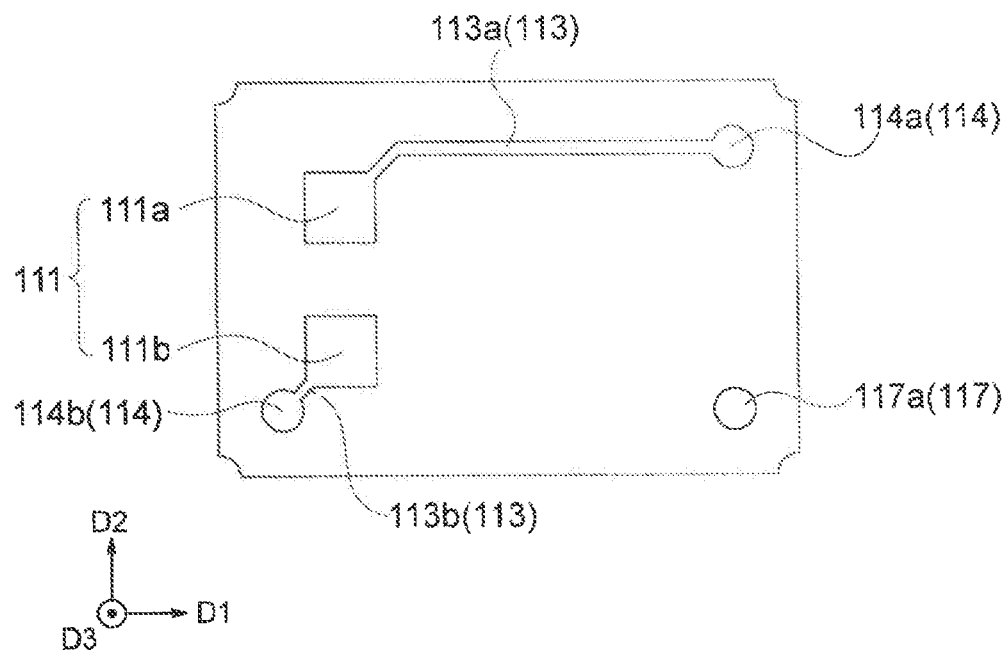
FIG. 4B is a plan view showing a substrate part of the package in FIG. 4A from the top surface.

One electrode pad 111a, as shown in FIGS. 4A and 4B, is connected to one end of one crystal element-use wiring pattern 113a. Further, the other end of one crystal element-use wiring pattern 113a, as shown in FIGS. 4A and 4B and FIGS. 5A and 5B, is connected through one first via conductor 114a to one first external connection-use electrode terminal G1a. Accordingly, one electrode pad 111a becomes electrically connected with one first external connection-use electrode terminal G1a. Further, the other electrode pad 111b, as shown in FIGS. 4A and 4B, is connected with one end of the other crystal element-use wiring pattern 113b. Further, the other end of the other crystal element-use wiring pattern 113b, as shown in FIGS. 4A and 4B and FIGS. 5A and 5B, is connected through the other first via conductor 114b to the other first external connection-use electrode terminal G1b. Accordingly, the other electrode pad 111b becomes electrically connected with the other first external connection-use electrode terminal G1b.

The bonding pads 115 are used for mounting the temperature sensor 130. The bonding pads 115 are provided as a pair on the lower surface of the substrate part 110a and provided adjoining each other at the center of the substrate part 110a. The bonding pads 115, as shown in FIG. 5A, are electrically connected to the second external connection-use electrode terminals G2 provided on the lower surface of the second frame 110c through sensor-use wiring patterns 116 provided on the lower surface of the substrate part 110a and second via conductors 117 formed inside the second frame 110c.

Figure 5A:
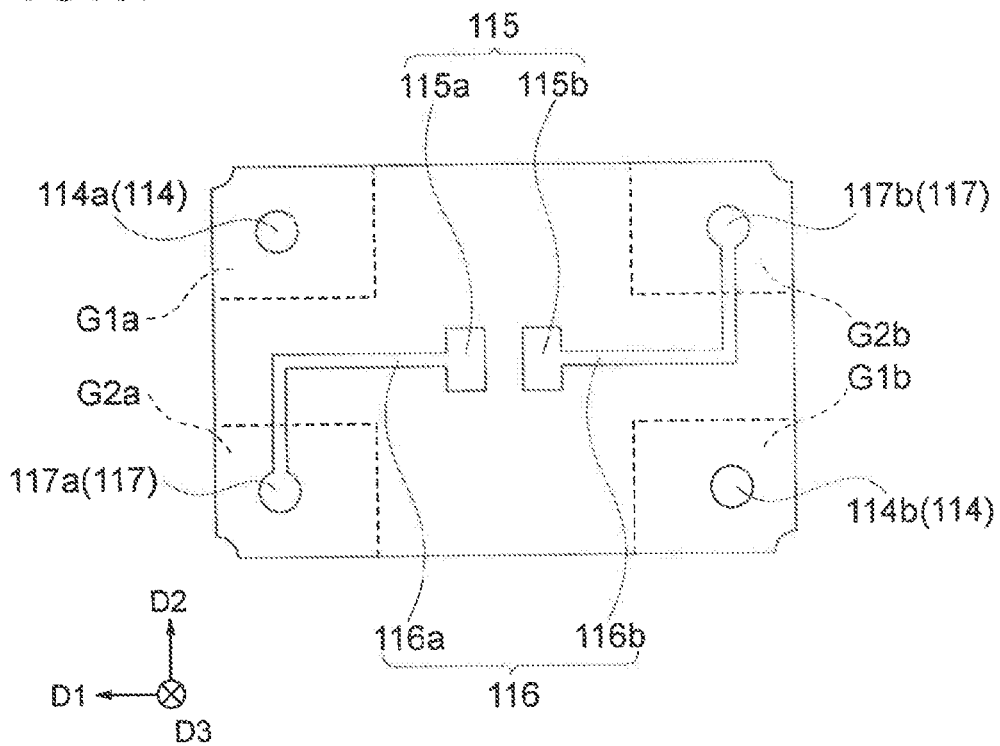
Figure 5B:
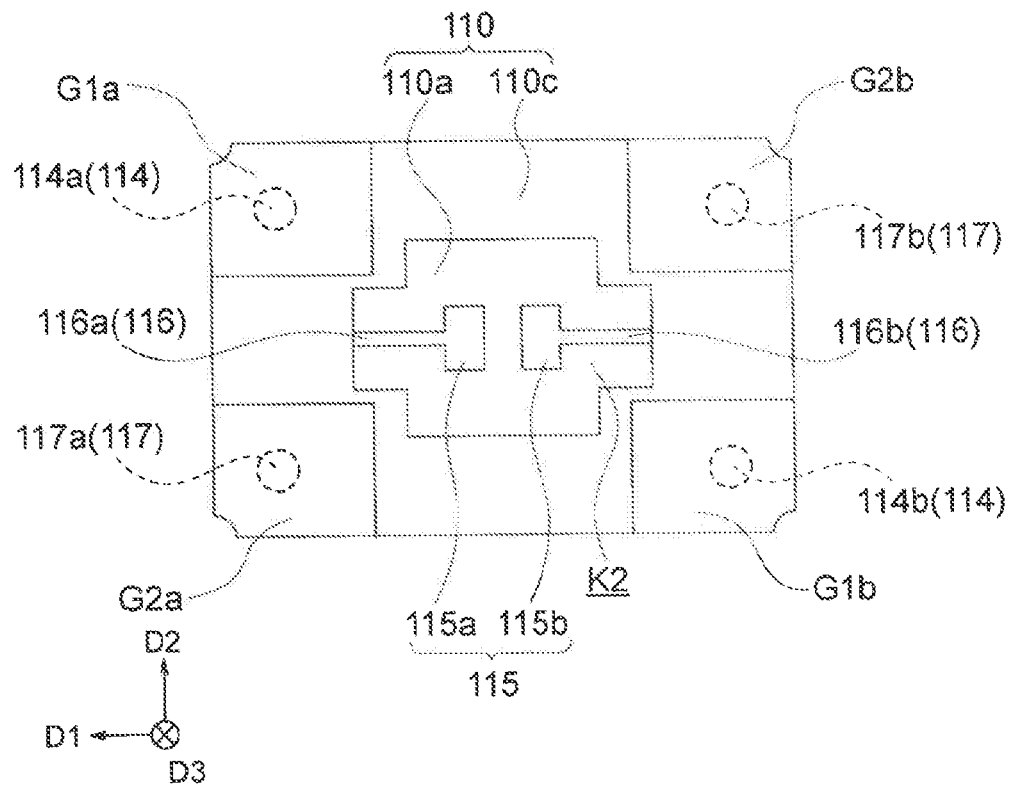
FIG. 5B is a plan view showing the package in FIG. 4A from the bottom surface.

One bonding pad 115a, as shown in FIG. 5A and FIG. 5B, is connected to one end of one sensor-use wiring pattern 116a. Further, the other end of one sensor-use wiring pattern 116a is connected through one second via conductor 117a to one second external connection-use electrode terminal G2a. Accordingly, one bonding pad 115a becomes electrically connected with one second external connection-use electrode terminal G2a. Further, the other bonding pad 115b, as shown in FIG. 5A and FIG. 5B, is connected to one end of the other sensor-use wiring pattern 116b. Further, the other end of the other sensor-use wiring pattern 116b is connected through the other second via conductor 117b to the other second external connection-use electrode terminal G2b. Accordingly, the other bonding pad 115b becomes electrically connected with the other second external connection-use electrode terminal G2b.

Further, the length of one sensor-use wiring pattern 116a and the length of the other sensor-use wiring pattern 116b which are exposed at the bottom surface in the second concave part K2 become substantially equal. That is, the lengths of the pair of sensor-use wiring patterns 116 become substantially equal. The lengths of the pair of sensor-use wiring patterns 116 exposed at the bottom surface in the second concave part K2 are about 200 to 250 µm. Here, "substantially equal lengths" include lengths where the difference between the wiring length of one sensor-use wiring pattern 116a and the wiring length of the other sensor-use wiring pattern 116b is 0 to 50 µm. Further, the length of a wiring is obtained by measuring the length of a straight line passing through the center of each wiring. By the wiring length of one sensor-use wiring pattern 116a and the wiring length of the other sensor-use wiring pattern 116b becoming substantially equal, the generated resistance values become equal and also the load resistance given to the temperature sensor 130 becomes uniform, therefore it becomes possible to stably output voltage.

When bonding the first frame 110b and the lid 140 through a sealing member 141, a sealing-use conductor pattern 112 (FIG. 1 and FIG. 2) plays the role of making the wettability of the sealing member 141 better. The sealing-use conductor pattern 112, as shown in FIGS. 4A and 4B and FIGS. 5A and 5B, is electrically connected through one second via conductor 117a to one second external connection-use electrode terminal G2a. Further, one second external connection-use electrode terminal G2a, by connection with the mounting pad which is connected to the ground of the reference potential of the external mounting substrate, plays the role of a ground terminal. Accordingly, the lid 140 joined to the sealing-use conductor pattern 112 is connected to the ground potential. Accordingly, a shield property in the first concave part K1 by the lid 140 is improved. The sealing-use conductor pattern 112 is formed to a thickness of for example about 10 to 25 μm by applying nickel plating and gold plating in that order to the surface of a conductor pattern made of for example tungsten or molybdenum or the like.

(Lid)

The lid 140 is for example formed by an alloy containing at least one of iron, nickel, or cobalt. Such a lid 140 is for air-tightly sealing the first concave part K1 in a vacuum state or the first concave part K1 filled with nitrogen gas or the like. Specifically, the lid 140 is placed on the first frame 110b of the package 110 in a predetermined atmosphere and is joined to the first frame 110b by performing seam welding by applying a predetermined current so that the sealing-use conductor pattern 112 of the first frame 110b and the sealing member 141 of the lid 140 are welded.

The sealing member 141 is provided at the position of the lid 140 facing the sealing-use conductor pattern 112 provided on the upper surface of the first frame 110b of the package 110. The sealing member 141 is for example provided by silver solder or gold-tin. In the case of silver solder, the thickness thereof is 10 to 20 μm. For example, use is made of a solder having a component ratio consisting of 72 to 85% of silver and 15 to 28% of copper. In the case of gold-tin, the thickness thereof is 10 to 40 μm. For example, use is made of a solder having a component ratio consisting of 72 to 82% of gold and 18 to 22% of tin.

(Crystal Element)

The crystal element 120, as shown in FIG. 2, is joined through a conductive adhesive 150 to the tops of the electrode pads 111. The crystal element 120 plays the role of oscillating the reference signals of an electronic apparatus and the like by stable mechanical vibration and a piezoelectric effect.

The crystal element 120, as shown in FIG. 1 and FIG. 2, is structured with an excitation electrode 122, a connection electrode 123, and an extraction electrode 124 attached to each of the upper surface and lower surface of the crystal blank 121. The excitation electrodes 122 are formed by coating a metal on the upper surface and lower surface of the crystal blank 121 with predetermined patterns. The extraction electrodes 124 extend out of the excitation electrodes 122 toward the short side of the crystal blank 121. The connection electrodes 123 are connected to the extraction electrodes 124 and are provided with shapes extending along a long side or short side of the crystal blank 121.

In the present embodiment, the crystal element 120 is fixed onto the substrate part 110a by a cantilever structure in which one end of the crystal element 120 connected to the electrode pads 111 is made a fixed end connected with the upper surface of the substrate part 110a and the other end is made a free end spaced apart from the upper surface of the substrate part 110a.

The outer circumferential edge on the fixed end side of the crystal blank 121 is parallel to one side of the substrate part 110a when viewed on a plane and is provided so as to become close to the inner circumferential edge of the first frame 110b. By providing it in this way, it is possible to make the mounting position of the crystal element 120 more understandable visually, therefore it becomes possible to improve the productivity of the crystal unit.

Here, the operation of the crystal element 120 will be explained. The crystal element 120 is configured so that when an alternating voltage from an external portion is applied from the connection electrodes 123 through the extraction electrodes 124 and excitation electrodes 122 to the crystal blank 121, the crystal blank 121 is excited by a predetermined vibration mode and frequency.

The method for bonding the crystal element 120 to the substrate part 110a will be explained. First, the conductive adhesive 150 is coated on the tops of the electrode pads 111 by for example a dispenser. The crystal element 120 is conveyed above the conductive adhesive 150 and is placed on the conductive adhesive 150. Further, the conductive adhesive 150 is heated for curing whereby it is hardened and contracts. The crystal element 120 is thereby joined to the pair of electrode pads 111.

The conductive adhesive 150 comprises a silicone resin or another binder in which a conductive filler of a conductive powder is contained. As the conductive powder, use is made of one containing any of aluminum, molybdenum, tungsten, platinum, palladium, silver, titanium, nickel, or iron or a combination of the same. Further, as the binder, use is made of for example a silicone resin, epoxy resin, polyimide resin, or bismaleimide resin.

(Crystal Blank)

The crystal blank 121 is for example a so-called AT-cut plate. That is, as shown in FIG. 1, it is a plate shape cut parallel to the XZ' plane when, in a quartz crystal, rotating an orthogonal coordinate system XYZ comprised of an X-axis (electrical axis), Y-axis (mechanical axis), and Z-axis (optical axis) by 30° to 40° (35° 15' as an example) around the X-axis to define an orthogonal coordinate system XY'Z'.

Note that, in the present disclosure, when referring to directions parallel to the axes described above, they will be described as the "+X axis direction" or "−X axis direction" when differentiating between the positive and negative directions or they will be simply referred to as the "X-axis directions" when not differentiating between the positive and negative directions.

The shape of the outer edge of the crystal blank 121 when viewed on a plane is for example substantially rectangular. The crystal blank 121 has a pair of major surfaces and a plurality of (four in the case of a rectangle when viewed on a plane) side surfaces connecting the outer edges of the pair of major surfaces to each other. The "major surfaces" designate the broadest surfaces (front and back of the plate-shaped member) among the plurality of surfaces (six surfaces in a plate-shape member which is rectangular when viewed on a plane) provided in a plate-shaped member. In the AT-cut plate, the major surfaces are the surfaces that substantially extend along the XZ' plane, the long sides of the major surfaces are the sides which substantially extend along the X-axis, and the short sides of the major surfaces are the sides which substantially extend along the Z' axis.

Note that, the planar shape of the crystal blank 121 need not be a perfect rectangle. For example, the corner portions of the rectangle may be chamfered to form flat surfaces or curved surfaces, or the long sides and/or short sides may be arc-shaped so that they expand outward, or the lengths of the two sides facing each other may be made different from each other. The terms the "long side" and "short side" are generally terms designating sides of a rectangle. In the present disclosure, when viewed on a plane, so long as the long direction and the short direction of the crystal blank 121 can be differentiated and the outer edge can be grasped of being comprised of a total of four lines including two lines which substantially extend along the long direction and two lines which substantially extend along the short direction, even if, as described before, a perfect rectangle is not formed, the four lines when viewed on a plane will be referred to as the "long sides" and "short sides".

The pair of major surfaces of the crystal blank 121 are for example finally formed by polishing. Further, the outer circumferential surfaces (plurality of side surfaces) of the crystal blank 121 are for example formed by etching and are configured by crystal planes appearing due to the etching. The crystal planes are for example inclined relative to the major surfaces. Note that, in FIG. 1 and FIG. 2, inclinations of the crystal planes were ignored when showing the side surfaces of the crystal blank 121.

Figure 6A:
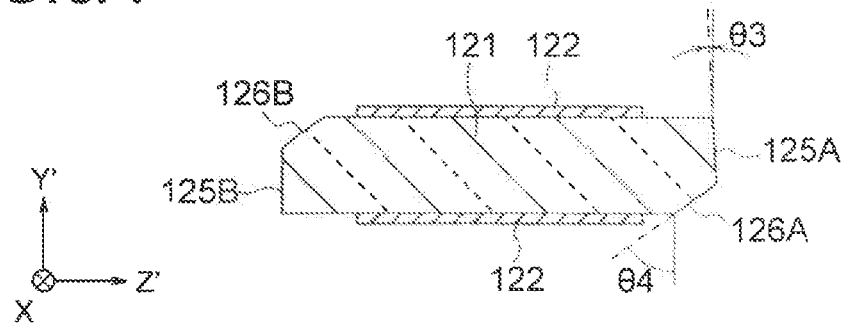
FIG. 6A is a cross-sectional view taken along a VIa-VIa line in FIG. 1.
Figure 6B:
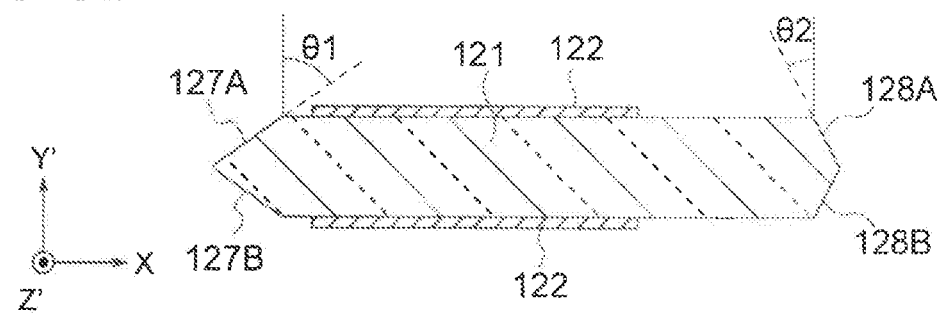
FIG. 6B is a cross-sectional view taken along a VIb-VIb line in FIG. 1.
Figure 6C:
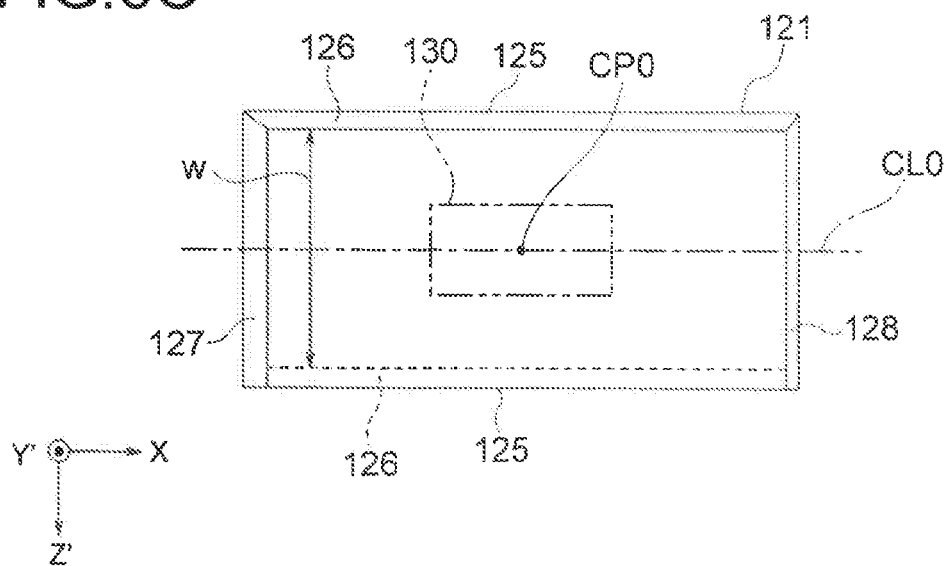
FIG. 6C is a plan view of the crystal blank.

FIG. 6A is a cross-sectional view taken along the VIa-VIa line in FIG. 1. FIG. 6B is a cross-sectional view taken along the VIb-VIb line in FIG. 1. FIG. 6C is a plan view of the crystal blank 121. In FIG. 6C, the temperature sensor 120 is indicated by two-dot chain lines.

Note that, in these views, in order to make visual confirmation of the crystal planes of the side surfaces of the crystal blank 121 easier, in comparison with the actual dimensional ratio, the dimension in the thickness direction is made larger relative to the dimension in the planar direction. On the other hand, the inclination angles of the crystal planes (for example θ1 to θ4) are shown so that they become closer to actual ones as much as possible.

As shown in FIG. 6A, on the cross-section perpendicular to the X-axis, the shape of the crystal blank 121 considering the crystal planes becomes a shape that is rotationally symmetrical by 180° relative to a not shown symmetric axis which is substantially parallel to the X-axis.

A side surface positioned in the -Z' axis direction of the crystal blank 121 is for example configured by two crystal planes 125B and 126B (below, sometimes B will be omitted). Further, a side surface positioned in the +Z' axis direction of the crystal blank 121 is for example configured by two crystal planes 125A and 126A (below, sometimes A will be omitted).

The inclination angle θ3 relative to the Y' axis of the crystal plane 125 is for example about 3° (for example, 1° to 5°). The inclination angle θ4 relative to the Y' axis of the crystal plane 126 is for example about 54° (for example, 52° to 56°). The position in the Y' axis direction of the ridge at which the two crystal planes 125 and 126 intersect with each other may be suitably set. For example, this is a position which substantially coincides with the center of the thickness of the crystal blank 121 or deviates a little from the center. Note that, the crystal plane 125 is indicated by a line in FIG. 6C since its inclination angle θ3 is small.

As shown in FIG. 6B, on the cross-section perpendicular to the Z' axis, the shape of the crystal blank 121 after considering the crystal planes becomes a shape that is linearly symmetrical with a not shown symmetric axis which is substantially parallel to the X-axis.

The side surface positioned in the -X axis of the crystal blank 121 is configured by for example two crystal planes 127A and 127B (below, sometimes A and B will be omitted). The inclination angle θ1 relative to the Y' axis of the crystal plane 127 is for example about 55° (for example 53° to 57°). The position in the Y' axis direction of the ridge at which the two crystal planes 127A and 127B intersect with each other for example substantially coincides with the center of the thickness of the crystal blank 121.

The side surface positioned in the +X axis of the crystal blank 121 is configured by for example two crystal planes 128A and 128B (below, sometimes A and B will be omitted). The inclination angle θ2 relative to the Y' axis of the crystal plane 128 is for example about 27° (for example 25° to 29°). The position in the Y' axis direction of the ridge at which the two crystal planes 128A and 128B intersect with each other for example substantially coincides with the center of the thickness of the crystal blank 121.

(Temperature Sensor)

Returning to FIG. 1 to FIG. 3, the temperature sensor 130 includes a diode (semiconductor diode, same below) and has an anode terminal 131b and cathode terminal 131a. The temperature sensor 130 has a forward characteristic of allowing current to flow from the anode terminal 131b to the cathode terminal 131a and allowing almost no current to flow from the cathode terminal 131a to the anode terminal 131b. The forward characteristic of the temperature sensor 130 greatly changes according to the temperature. Specifically, the forward voltage when making a constant current flow in the temperature sensor 130 changes linearly (in a straight line) relative to a temperature change. By measuring this voltage, temperature information can be obtained. The temperature information is for example utilized for compensation for a change of characteristic of the crystal unit caused due to the temperature change by a main IC (integrated circuit) of a not shown electronic apparatus or the like.

The temperature sensor 130, as shown in FIG. 2 and FIG. 3, is mounted on the bonding pads 115 provided on the substrate part 110a exposed in the second concave part K2 of the package 110 through solder or another conductive bonding material. Further, the cathode terminal 131a of the temperature sensor 130 is connected to one bonding pad 115a, while the anode terminal 131b is connected to the other bonding pad 115b. Accordingly, the cathode terminal 131a of the temperature sensor 130 is connected to one second external connection-use electrode terminal G2a given the reference potential. From another viewpoint, a voltage in accordance with the temperature of the temperature sensor 130 is output through the other second external connection-use electrode terminal G2b to the outside of the crystal unit.

Further, in the temperature sensor 130, a current of 1 to 200 μA flows. Therefore, even in a case where a circuit arranged on the mother board of the electronic apparatus is high in impedance, a sufficient current can be secured. As a result, superimposition of noise generated due to a small current value in the temperature sensor 130 can be reduced. Further, unless it exceeds the forward voltage of the temperature sensor 130, the quantity of the flowing current does not suddenly become larger, therefore the amount of heat generation of the temperature sensor 130 can be reduced. By making the reading error from the actual temperature of the crystal element 120 smaller, it becomes possible to correct a reading with a high precision. Accordingly, the crystal unit can improve the precision of temperature compensation relative to the oscillation frequency of the crystal element 120.

As shown in FIG. 2 and FIG. 6C, the temperature sensor 130, when viewed on a plane, is arranged at a position that overlaps the crystal element 120. More specifically, for example, the temperature sensor 130, when viewed on a plane, is arranged at position that falls inside the crystal blank 121 and does not overlap the side surfaces of the crystal blank 121 (from another viewpoint, the crystal planes 125 to 128).

Further, for example, when viewed on a plane, a center line CL0 parallel to the X-axis of the region of the pair of major surfaces of the crystal blank 121 in which they overlap each other and the center line (not shown) parallel to the X-axis of the temperature sensor 130 coincide. Note that, the region of the pair of major surfaces in which they overlap each other as described above, in other words, is a region in one major surface, which does not overlap the crystal planes of the side surfaces when viewed on a plane. FIG. 6C shows a width W in the Z' axis direction of this region of the pair of major surfaces in which they overlap each other.

Further, for example, when viewed on a plane, the center (center of gravity of figure) of the temperature sensor 130 for example substantially coincides with the center (center of gravity of figure) of the package 110 and/or center CP0 (center of gravity of figure) of the major surface of the crystal blank 121.

The temperature sensor 130 has for example a shape that is longer in the X-axis (for example substantially rectangular). The cathode terminal 131a and anode terminal 131b are positioned on the two sides of the X-axis of the temperature sensor 130.

The anode terminal 131b of the temperature sensor 130, when viewed on a plane, is arranged on the electrode pad 111 side on which the crystal element 120 is mounted. When viewed on a plane, an interval between the side of the electrode pad 111 facing the excitation electrode 122 side and the side of the other bonding pad 115b on which the anode terminal 131b of the temperature sensor 130 is mounted and which faces the electrode pad 111 side is 0 to 100 μm. Further, the other sensor-use wiring pattern 116b, when viewed on a plane, is provided so as to pass between the pair of electrode pads 111.

The temperature sensor 130 is positioned within a plane of an excitation electrode 122 provided on the crystal element 120 when viewed on a plane. Accordingly, according to a shield effect by the metal film of the excitation electrode 122, the temperature sensor 130 can be protected from noise from the other semiconductor parts or electronic parts such as a power amplifier configuring the electronic apparatus. Accordingly, the temperature sensor 130 can correctly output a voltage.

The bonding method of the temperature sensor 130 to the package 110 will be explained. First, a conductive bonding material is coated on the tops of the bonding pads 115 by for example a dispenser. The temperature sensor 130 is conveyed over the conductive bonding material and is placed on the conductive bonding material. Then, the conductive bonding material is heated to thereby melt it for bonding. The temperature sensor 130 is thereby bonded to the pair of bonding pads 115. Note that, the conductive bonding material may be coated on the cathode terminal 131a and anode terminal 131b in place of the bonding pads 115 as well.

The conductive bonding material is for example comprised of a silver paste or lead-free solder. Further, the conductive bonding material contains a solvent added for adjusting the viscosity so that coating becomes easier. As the lead-free solder, use is made of one having a component ratio consisting of 95 to 97.5% of lead, 2 to 4% of silver, and 0.5 to 1.0% of copper.

(Specific Configuration of Temperature Sensor)

FIG. 7A is a plan view showing an outer appearance of the temperature sensor 130. FIG. 7B is a plan view showing the configuration of a semiconductor substrate 132 of the temperature sensor 130. FIG. 7C is a cross-sectional view taken along the VIIc-VIIc line in FIG. 7A. However, for convenience, hatching is not attached to the cross-section of the semiconductor substrate 132.

The temperature sensor 130 is configured by provision of the cathode terminal 131a and anode terminal 131b on the major surface 132a of the semiconductor substrate 132. That is, the temperature sensor 130 is a bare chip and does not have a package surrounding the semiconductor substrate 132.

The semiconductor substrate 132 for example has a substantially constant thickness over its entire surface. The planar shape of the semiconductor substrate 132 may be suitably set and is for example substantially rectangular (rectangular which is not square in the example shown). The cathode terminal 131a and anode terminal 131b are arranged with a space from each other in the direction (D1 axis direction) in which two sides of the rectangle (short sides in the example shown) face each other.

The semiconductor substrate 132, in the major surface 132a, has a p-type region 132p comprised of a p-type semiconductor and an n-type region 132n comprised of an n-type semiconductor. More specifically, the semiconductor substrate 132 has an n-type layer 133n comprised of an n-type semiconductor and a p-type layer 133p comprised of a p-type semiconductor which is positioned on the n-type layer 133n in a partial region of the n-type layer 133n. Further, the p-type region 132p is configured by a p-type layer 133p, and the n-type region 132n is configured by the region in the n-type layer 133n in which the p-type layer 133p is not arranged.

The thicknesses of the n-type layer 133n and p-type layer 133p may be suitably set. In the example shown, the thickness of the n-type layer 133n in the n-type region 132n becomes the thickness of the semiconductor substrate 132. The thickness of the p-type layer 133p becomes for example half or less of the thickness of the semiconductor substrate 132.

The p-type layer 133p and the n-type layer 133n are in contact each other and configure a pn junction. The anode terminal 131b is provided on the p-type region 132p, while the cathode terminal 131a is provided on the n-type region 132n. In this way, a diode 134 is configured on the semiconductor substrate 132. As understood from the above explanation, the diode 134 is a so-called planar structure one.

The manufacturing method of such a diode 134 may be made the same as various known manufacturing methods excluding the dimensions and other specific conditions. For example, first, an n-type semiconductor wafer from which a plurality of semiconductor substrates 132 can be obtained is prepared. The n-type semiconductor wafer is for example a silicon (Si) wafer containing phosphorus (P), antimony (Sb), or the like as impurities. Next, into the region which becomes the p-type regions 132p, boron (B) or other impurities is injected through a mask. Next, a suitable thin-film forming method is used to form the anode terminal 131b and cathode terminal 131a. After that, the semiconductor wafer is diced to separate it into pieces.

In the diode 134 having the configuration as described above, when a forward voltage is applied to the anode terminal 131b and cathode terminal 131a, since the anode terminal 131b and cathode terminal 131a are positioned on the major surface 132a, as indicated by an arrow y1, the current is apt to flow near the major surface 132a. From another viewpoint, when viewed on a plane, the current is apt to flow so as to pass over a boundary portion 132b (pn junction surface) of the p-type region 132p and the n-type region 132n.

The p-type layer 133p is positioned on the n-type layer 133n. Therefore, as indicated by an arrow y2, it is possible for the current to flow even through the boundary surface 133b (pn junction surface) between the lower surface of the p-type layer 133p and the n-type layer 133n. Note, the longer the spacing of the boundary surface 133b from the major surface 132a, the longer the route of the current from the anode terminal 131b through the boundary surface 133b and reaching the cathode terminal 131a. Consequently, the resistance of the route increases, and the current becomes harder to flow.

Accordingly, in the diode 134, among temperatures of a variety of portions in the semiconductor substrate 132, the temperature in the major surface 132a has the largest influence upon the forward characteristic of the diode 134. The relative proportions of the boundary portion 132b and the boundary surface 133b influencing the forward characteristic change according to the depth of the position of the boundary surface 133b. However, the tendency itself of the influence of the temperature in the major surface 132a exerted upon the forward characteristic being large does not change.

Note that, even if the p-type layer 133p is equal in thickness to the semiconductor substrate 132, since the anode terminal 131b and cathode terminal 131a are positioned on the major surface 132a, in the same way as the above description, the current flowing to the lower surface side (negative side of the D3 axis) of the semiconductor substrate 132 becomes smaller, therefore the tendency itself of the influence of the temperature in the major surface 132a exerted upon the forward characteristics being large does not change.

Accordingly, by the anode terminal 131b being provided on the p-type region 132p configuring part of the major surface 132a and the cathode terminal 131a being provided on the n-type region 132n configuring part of the major surface 132a, the diode 134 can be said to be configured to detect the temperature on the surface (major surface 132a) (detect the temperature of the major surface 132a).

The thinner the p-type layer 133p, the closer the temperatures of the boundary portion 132b and the boundary surface 133b to the temperature of the major surface 132a, therefore the temperature of the major surface 132a can be detected with a high precision. For example, the thickness of the p-type layer 133p may be made ½ or less or ⅕ or less of the thickness of the semiconductor substrate 132.

Note that, the p-type layer 133p is formed in only a portion on the major surface 132a side of the semiconductor substrate 132, and the anode terminal 131b and cathode terminal 131a are positioned on the major surface 132a, therefore the diode 134 may be grasped as being configured in a portion on the major surface 132a side in the semiconductor substrate 132. Also from this viewpoint, the temperature sensor 130 may be a sensor which detects the temperature on the surface (major surface 132a).

In the example shown, an aspect configuring a portion of the n-type semiconductor wafer by a p-type semiconductor was taken as an example. However, a portion of a p-type semiconductor wafer may be configured by an n-type semiconductor as well. That is, in the diode 134, the n-type layer may be positioned on the p-type layer in a partial region of the p-type layer, and the p-type region 132p and n-type region 132n may be configured in the major surface 132a by this.

(Outline of Manufacturing Method of Crystal Element)

Figure 8:
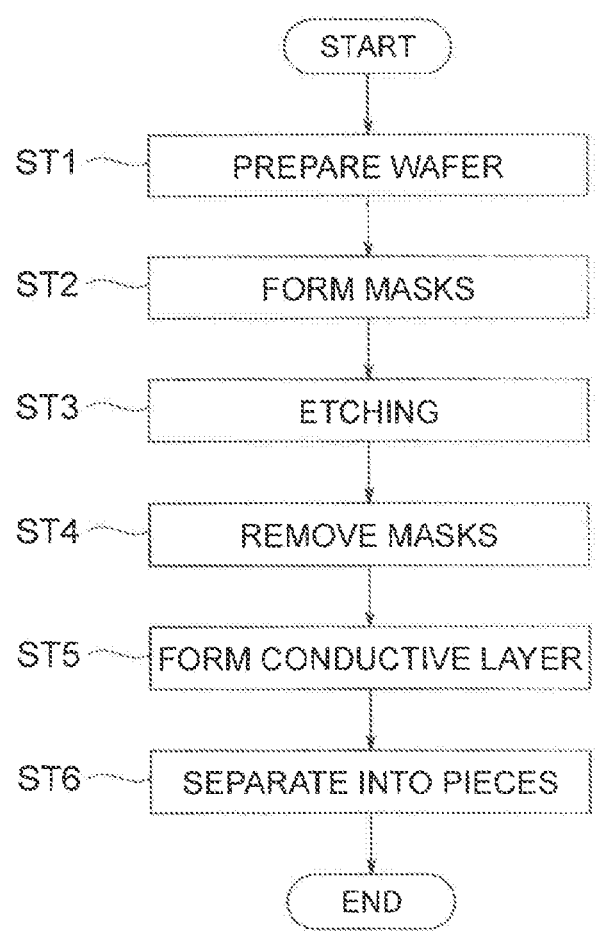
FIG. 8 A flow chart showing an example of outline of the procedure of a manufacturing method of the crystal element in FIG. 1.
Figure 9A:
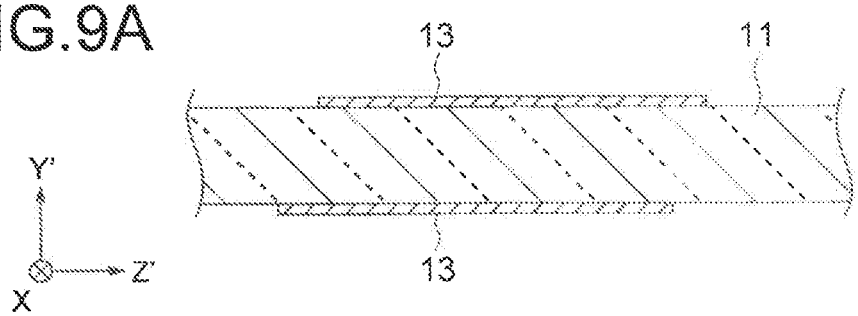
FIG. 9A, FIG. 9B, FIG. 9C, and FIG. 9D are cross-sectional views for explaining the manufacturing method of the crystal element in FIG. 1.
Figure 9B:
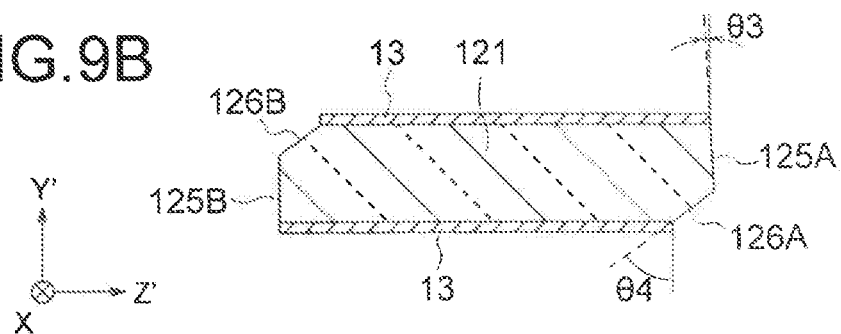

FIG. 8 is a flow chart showing an example of an outline of the procedure of a method for manufacturing the crystal element 120. Further, FIG. 9A to FIG. 9D are plan views showing a portion of a wafer 11 from which multiple crystal blanks 121 can be taken. FIG. 9A and FIG. 9B correspond to FIG. 6A, while FIG. 9C and FIG. 9D correspond to FIG. 6B.

At step ST1, a wafer 11 made of quartz crystal is prepared. Note that, it is sufficient that the "wafer" referred to here be plate-shaped from which multiple crystal blanks 121 can be taken and need not be disk-shaped. For example, the planar shape of the wafer 11 may be rectangular as well.

The wafer 11 may be prepared for example in the same way as the known method. Specifically, for example, by lumbering and slicing an artificial crystal, wafers are cut out at the angles explained with reference to FIG. 1. Further, by lapping, etching, and/or polishing the cut-out wafer, a wafer 11 having a pair of major surfaces which are parallel to each other is formed.

Figure 9C:
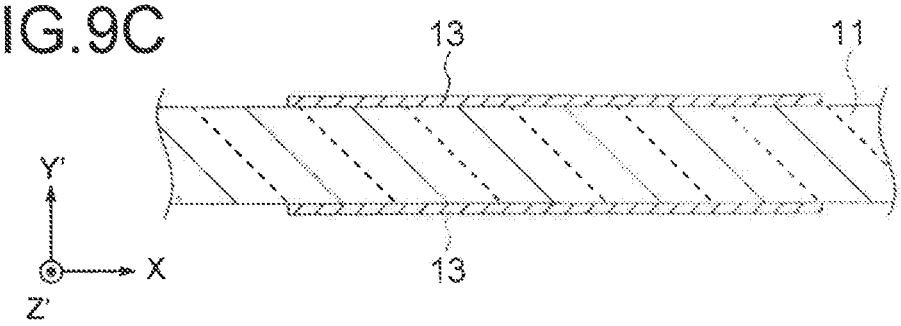

At step ST2, as shown in FIG. 9A and FIG. 9C, the pair of major surfaces of the wafer 11 are formed with masks 13 for etching of the wafer 11. The masks 13 have a plurality of blank corresponding portions (shown portions. Notations omitted) each having substantially the same planar shape as the planar shape of a crystal blank 121, a frame (not shown) surrounding the plurality of blank corresponding portions when viewed on a plane, and a plurality of connection parts (not shown) which connect the plurality of blank corresponding portions and the frame. The connection parts are for example connected with respect to the blank corresponding portions at the positions corresponding to the two ends of one short side.

Note that, as shown in FIG. 9A, the positions of the pair of masks 13 (element corresponding portions) may be offset from each other as well. Due to this, for example, the position in the Y' axis direction of a ridge at which the crystal planes 125 and 126 intersect can be adjusted.

Each mask 13, for example, although not particularly shown, is configured by a combination of a metal film and a resist film superimposed over that. The metal film is for example comprised of chromium. The resist film may be either of a positive type or negative type photoresist. These may be formed in the same way as the known method. For example, first, by a sputtering process or the like, a metal film is formed on a major surface of the wafer 11 over its entire surface. Next, the spin coating method or the like is used to form a resist film on the metal film over its entire surface. Next, the resist film is patterned by photolithography. Next, the metal film is etched through the resist film to pattern the metal film. Due to this, a mask 13 is formed. Note that, after that, the resist film may be removed so that the mask 13 is configured by only the metal film.

Figure 9D:
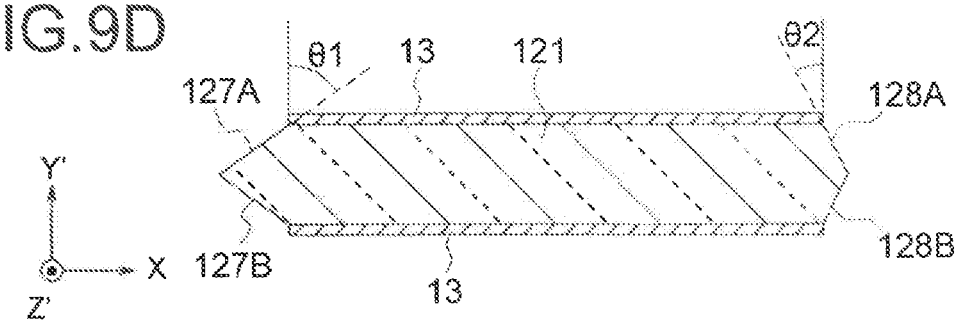

At step ST3, as shown in FIG. 9B and FIG. 9D, wet etching is carried out with respect to the wafer 11 through the masks 13. For example, the wafer 11 is immersed in a liquid tank containing a chemical solution. This etching is carried out just below the openings of the masks 13 up to formation of through holes in the wafer 11. Due to this, crystal blanks 121 having major surfaces with the same planar shapes as those of the element corresponding portions are formed just below the element corresponding portions of the masks 13. However, at this point of time, a plurality of crystal blanks 121 are connected to the frame of the wafer 11 in a portion of the side surface on the +Z or −Z side.

In this etching, crystal planes 125 to 128 configuring the side surfaces of the crystal blank 121 appear. Note that, in the present disclosure, illustration of undercut is omitted (ideal etching is shown). In actuality, a little undercut may be formed as well. By undercut advancing, a new crystal plane may appear as well.

At step ST4, the masks 13 are removed from the wafer 11. For example, the wafer 11 is dipped in a suitable liquid chemical solution for removing the masks 13.

At step ST5, each crystal blank 121 is formed with a pair of excitation electrodes 122, a pair of connection electrodes 123, and a pair of extraction electrodes 124. The method of formation of these conductive layers may be for example the same as a known method. Specifically, for example, these conductive layers are formed by formation of a conductive material through the masks or formed by formation of a film of a conductive material, then etching through the masks.

At step ST6, each crystal blank 121 is separated from the wafer 11 (its frame). For example, a crystal blank 121 is pressed or sucked up to break the connection parts connecting the frame and the crystal blank 121. Due to this, a plurality of separated single crystal elements 120 are prepared.

As described above, in the present embodiment, the crystal unit 1 has the package 110, crystal element 120, and temperature sensor 130. The crystal element 120 includes the crystal blank 121 and the pair of excitation electrodes 122 positioned on the pair of major surfaces of the crystal blank 121 and is air-tightly sealed in the package 110. The temperature sensor 130 is mounted in the package 110. The crystal blank 121, in at least a portion of the side surfaces, includes crystal planes 125, 126, 127, and/or 128 which are inclined relative to the major surfaces.

Accordingly, for example, the difference between the temperature detected by the temperature sensor 130 and the temperature of the crystal blank 121 can be reduced. Specifically, this is as follows.

Consider a case where the temperature of an external environment of the crystal unit 1 changes. In such a case, since a quartz crystal has a lower thermal conductivity in comparison with a metal and semiconductor, a relatively long time delay occurs from when the temperature of the space around the crystal blank 121 (space in the first concave part K1) and/or the members abutting against the crystal blank 121 (excitation electrodes 122 etc.) changes to when the temperature change is transferred to the entire crystal blank 121 (internal portion from another viewpoint). On the other hand, the temperature sensor 130 is provided for the purpose of the detection of temperature. Therefore, usually the time delay of the detection temperature from the change of the temperature of the space around the temperature sensor 130 (space in the second concave part K2) and/or the members abutting against the temperature sensor 130 (bonding pads 115 etc.) is relatively short. Accordingly, the detection temperature ends up following the temperature of the external environment earlier than the actual temperature of the crystal blank 121, therefore the detection temperature is liable to end up deviating from the actual temperature of the crystal blank 121.

Here, the role of the excitation electrodes 122 is large in the process of relaying the temperature change of the external environment to the crystal blank 121. As the reason for that, for example the following reason can be mentioned. The interior of the first concave part K1 is evacuated (strictly speaking, reduced in pressure). Therefore, in theory, the temperature change of the external environment is not transferred through the space on the periphery of the crystal element 120 to the crystal element 120. Otherwise, even if a gas is sealed in the first concave part K1, the thermal conductivities of the gas and the package 111 are relatively low, therefore a temperature change of the external environment is not conveyed much at all to the crystal element 120 through the space on the periphery of the crystal element 120. On the other hand, the crystal element 120 is bonded to the upper surface of the substrate part 110a by the conductive adhesive 150, therefore it is easily influenced by a temperature change of the substrate part 110a. Specifically, a conductor is higher in thermal conductivity than a quartz crystal, therefore the temperature change transferred from the conductive adhesive 150 to the connection electrodes 123 is easily transferred through the extraction electrodes 124 and excitation electrodes 122 to the crystal blank 121. Conductive routes are formed from the first external connection-use electrode terminals G1 through the electrode pads 111 to the conductive adhesive 150, therefore the temperature of the external environment is further easily transferred through the excitation electrodes 122 to the crystal blank 121.

On the other hand, when the length in the X-axis direction or Z' axis direction of the crystal blank 121 is designed and/or measured, for example, the length at the position where it becomes the longest is made the standard. For example, as the length in the Z' axis direction, the length of the crystal blank 121 is measured using the position in the X-axis direction of the ridge formed by the crystal plane 125A and the crystal plane 126A and the position in the X-axis direction of the ridge formed by the crystal plane 125B and the crystal plane 126B as the standard. Accordingly, in comparison with a crystal blank which has the same dimensions (design values) as the crystal blank 121 in the present embodiment but in which the side surfaces are formed by machining unlike the present embodiment and the side surfaces are perpendicular to the major surfaces, the crystal blank 121 becomes smaller in volume. In other words, when the crystal blank 121 and a crystal blank obtained by machining have excitation electrodes 122 having the same dimensions, the crystal blank 121 is smaller in volume.

Accordingly, the crystal blank 121, in comparison with a crystal blank obtained by machining, is more easily influenced by a temperature change of the excitation electrodes 122. Consequently, the time delay of a temperature change of the crystal blank 121 with respect to a temperature change of the external environment is shortened. As a result, the difference between the detection temperature and the temperature of the crystal blank 121 is reduced.

Further, in the present embodiment, the major surfaces of the crystal blank 121 are shaped with lengths in the predetermined long direction (D1 axis direction) longer than the lengths of the short direction (D2 axis direction) perpendicular to the long direction when viewed on a plane. The crystal blank 121 has a pair of side surfaces (long sides) extending along the long direction. This pair of side surfaces (long sides) include crystal planes 125 and 126 inclined relative to the major surfaces. The crystal element 120 is supported upon the package 110 on only one end side (−D1 side) of the long direction. When viewing the crystal blank 121 on a plane, the temperature sensor 130 falls within the crystal blank 121 and is arranged at a position that does not overlap the pair of side surfaces (crystal planes 125 and 126 from another viewpoint).

Accordingly, it becomes easier to make the temperature sensor 130 exhibit the same temperature change as the temperature change of the crystal blank 121. Specifically, this is as follows.

When the temperature of the external environment changes, the crystal blank 121, as explained above, is easily influenced by the temperature change of the package 110 (substrate part 110*a*) through the conductive adhesive 150 (in other words, the support position of the crystal element 120). Further, the crystal element 120 has the connection electrodes 123 and extraction electrodes 124 only on the support position side, therefore the area of the conductor having a high thermal conductivity is secured on the support position side. From such circumstances, in the crystal blank 121, a uniform temperature change does not occur when viewed on a plane, but the temperature change is apt to advance from the support position side.

On the other hand, when viewed on a plane, the portion in the package 110 on which the temperature sensor 130 is mounted is a portion overlapping the crystal blank 121 and is the substrate part 110*a* in the present embodiment. The substrate part 110*a* holds only one end side of the crystal element 120, therefore the electrode pads 111 are positioned on only one side in the D1 axis direction. That is, this means that the area of the conductor which is easily influenced by the temperature change of the external environment through the first external connection-use electrode terminals G1 is secured only on one side of the D1 axis direction. Accordingly, the temperature change of the substrate part 110*a* is apt to advance from the support position side of the crystal element 120.

Accordingly, a temperature change of the substrate part 110*a* which exerts an influence upon the temperature of the temperature sensor 130 ends up advancing in the same direction as the advance of the temperature change in the crystal blank 121. As a result, for example, by attaching the temperature sensor 130 at an inner side from a specific part (crystal planes) of the crystal blank 121 when viewed on a plane, it becomes easier to make a temperature change the same as the temperature change of the crystal blank 121 occur in the temperature sensor 130.

In particular, when viewing a crystal blank 121 on a plane, if the center line CL0 of the regions of the pair of major surfaces overlapping each other (see the width W in FIG. 6C) which is parallel to the long direction of the crystal blank 121 and the center line of the temperature sensor 130 which is parallel to the long direction coincide, the temperature sensor 130 is uniformly spaced from the pair of specific portions (crystal planes), therefore the above effect is improved.

Further, in the present embodiment, the temperature sensor 130 has a shape that is longer in the long direction (D1 axis direction) of the crystal blank 121 and has a pair of terminals (cathode terminal 131*a* and anode terminal 131*b*) on the two sides of the long direction.

The cathode terminal 131*a* and anode terminal 131*b* are conductors and are bonded to the package 110, therefore the temperature sensor 130 is easily influenced by a temperature change of the package 110 through these terminals. On the other hand, as explained above, a temperature change is apt to be transferred to each of the crystal blank 121 and the substrate part 110*a* from the support position side of the crystal element 120. Accordingly, by only one terminal (here, the anode terminal 131*b*) being positioned on the support position side of the crystal element 120, for example, a time delay of a temperature change even in the temperature sensor 130 can be caused in the same way as a time delay of a temperature change of the crystal blank 121.

The temperature sensor 130 is mounted in a predetermined region (lower surface of the substrate part 110*a*) in the surface of the package 110 and detects the temperature on the surface on the predetermined region side.

As described above, a temperature change of the external environment is easily transferred to the crystal element 120 through the package 110 to which the crystal element 120 is bonded. Accordingly, by using a temperature sensor 130 detecting the temperature on the major surface 132*a* on the surface side of the package 110, in comparison with the aspect of a temperature sensor detecting the temperature in the entire chip unlike the present embodiment, the detection temperature can more easily follow the temperature of the package 110. The temperature sensor 130 is mounted (bonded) on the surface of the package 110, therefore a temperature change of the package 110 is apt to be transferred to the major surface 132*a* and it becomes further easier for the detection temperature to follow the temperature of the package 110. Accordingly, the detection temperature can more easily follow the temperature of the crystal element 120, therefore temperature compensation based on the detection temperature can be carried out with a high precision.

Further, in the present embodiment, the package 110 has a substrate part 110*a*, a first frame 110*b* positioned on the upper surface of the substrate part 110*a*, and a second frame 110*c* positioned on the lower surface of the substrate part 110*a*. The lid 140 is bonded to the upper surface of the first frame 110*b* and air-tightly seals the interior of the first frame 110*b*. The crystal element 120 is accommodated in the first frame 110*b* and is mounted on the upper surface of the substrate part 110*a*. The temperature sensor 130 is accommodated in the second frame 110*c*, and is mounted on the lower surface of the substrate part 110*a*, and detects the temperature on the surface (major surface 132*a*) on the substrate part 110*a* side.

Accordingly, the crystal element 120 and the temperature sensor 130 are mounted on the front and back of the substrate part 110*a*. Due to this, the effect described above of the detection temperature obtained by detecting the temperature on the surface by the temperature sensor 130 becoming easier to follow the temperature of the crystal element 120 is improved. Further, the space in the first concave part K1 for accommodating the crystal element 120 is not influenced much at all by the temperature of the external environment as described above. On the other hand, the space in the second concave part K2 for accommodating the temperature sensor 130 is easily influenced by the temperature of the external environment since the second concave part K2 is opened and the like. However, by the temperature sensor 130 being one detecting the temperature on the surface on the substrate part 110*a* side, the detection temperature thereof becomes less influenced by a temperature change of the space in the second concave part K2 (space other than gap between substrate part 110*a* and temperature sensor 130). As a result, the temperature sensor 130 becomes able to detect a temperature change similar to a temperature change of the crystal element 120. Consequently, the detection temperature becomes easier to follow the temperature of the crystal element 120, therefore temperature compensation based on the detection temperature can be carried out with a high precision.

Further, in the present embodiment, the temperature sensor 130 has a sensor substrate (semiconductor substrate 132) which is surface-mounted facing a predetermined region (lower surface of the substrate part 110a) and a temperature measurement part (diode 134) changing in electrical characteristics in accordance with the temperature and positioned on the predetermined region side (substrate part 110a side) of the semiconductor substrate 132.

From another viewpoint, the temperature sensor 130 has a semiconductor substrate 132 which is surface-mounted facing a predetermined region (lower surface of the substrate part 110a). The major surface 132a on the predetermined region side (substrate part 110a side) of the semiconductor substrate 132 includes a p-type region 132p and n-type region 132n configuring the diode 134.

That is, the temperature sensor 130 is a bare chip or WLP (wafer level package) type chip or the like. Accordingly, for example, the crystal unit 1 can be reduced in size. Further, for example, in comparison with the case where a package is provided, the diode 134 (temperature measurement part) will be directly influenced by the temperature of the substrate part 110a, therefore the sensitivity of the temperature sensor 130 is improved.

Further, in the present embodiment, the crystal element 120 is supported only on one end side of the first direction (D1 axis direction) parallel to the upper surface of the substrate part 110a. The semiconductor substrate 132 has a first layer (n-type layer 133n) with a partial region configuring either of a p-type region 132p or n-type region 132n (n-type region 132n in the example shown) and a second layer (p-type layer 133p) which is positioned on the first layer in a region different from the partial region described before and thereby configuring the other of the p-type region and the n-type region (p-type region 132p in the example shown). At least a portion of the second layer (entire portion in the present embodiment) is positioned closer to one side or the other side of the first direction than the support position of the crystal element 120 (electrode pads 111).

Here, unlike the present embodiment, assume that the thickness of the p-type layer 133p is equal to the thickness of the semiconductor substrate 132 and that the pn junction surface is only the surface which is substantially perpendicular to the D1 axis (boundary portion 132b) (such an aspect is also included in the art according to the present disclosure). In this case, when a temperature change of the substrate part 110a advances along the D1 axis direction as explained above, at the time when the temperature change reaches the boundary portion 132b, a change of the forward characteristic appears and consequently the detection temperature relatively suddenly changes. This change of detection temperature is liable to not always reflect the temperature change of the crystal element 120.

However, if the p-type layer 133p is positioned on the n-type layer 133n, the boundary surface 133b expands in the D1 axis direction. Further, a change of the forward characteristic on the boundary surface 133b appears little by little in the process of advance of the temperature change of the substrate part 110a on the boundary surface 133b in the D1 axis direction. Consequently, a sudden change of the detection temperature is mitigated. Note that, as already explained, if the boundary surface 133b is located at a position away from the major surface 132a (cathode terminal 131a and anode terminal 131b), the current exceeding the boundary surface 133b becomes smaller. Accordingly, the effect is improved more as the p-type layer 133p (second layer) is thinner.

Further, in the present embodiment, the thickness of the second frame 110c is thinner than a half of the total thickness of the first frame 110b and substrate part 110a.

When making the second frame 110c thinner, the temperature sensor approaches the external environment through the opening of the second frame 110c. Accordingly, unlike the present embodiment, where the temperature sensor is one detecting the temperature in the entire chip, the influence of the temperature change of the external environment exerted upon the detection temperature without going through the substrate part 110a becomes relatively larger. As a result, the detection temperature is liable to deviate from the temperature of the crystal element 120—which is influenced by a temperature change of the external environment through the substrate part 110a. However, in the present embodiment, the temperature sensor 130 detects the temperature on the major surface 132a on the substrate part 110a side, therefore it is not influenced much at all by a temperature change from a side other than the substrate part 110a side. Accordingly, the package 110 can be reduced in size while suppressing a drop of the detection precision.

Note that, in the above embodiment, the semiconductor substrate 132 is one example of the sensor substrate. The diode 134 is one example of the temperature measurement part.

Second Embodiment

Figure 10:
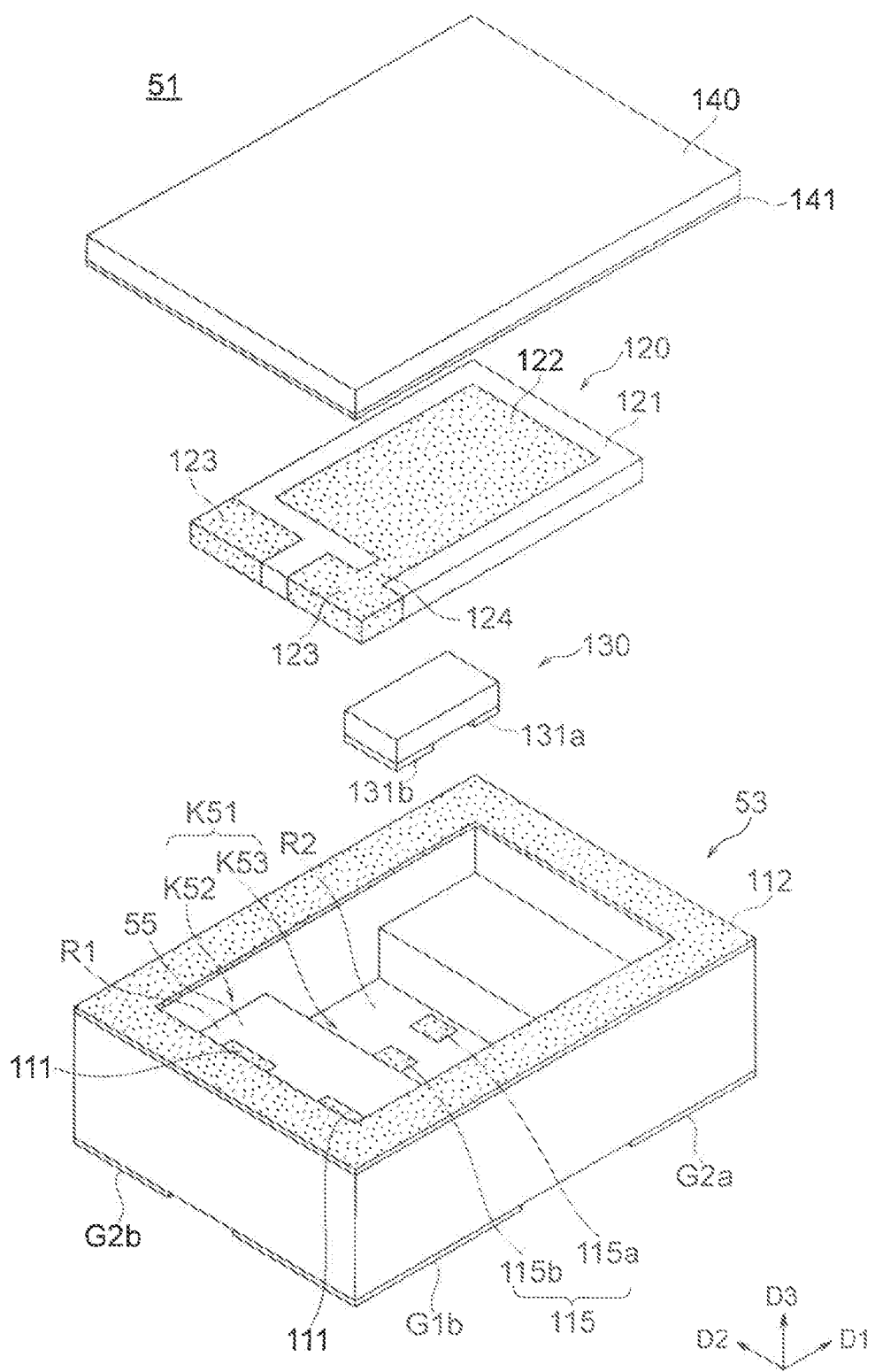
FIG. 10 A disassembled perspective view showing the configuration of a crystal unit according to a second embodiment.
Figure 11A:
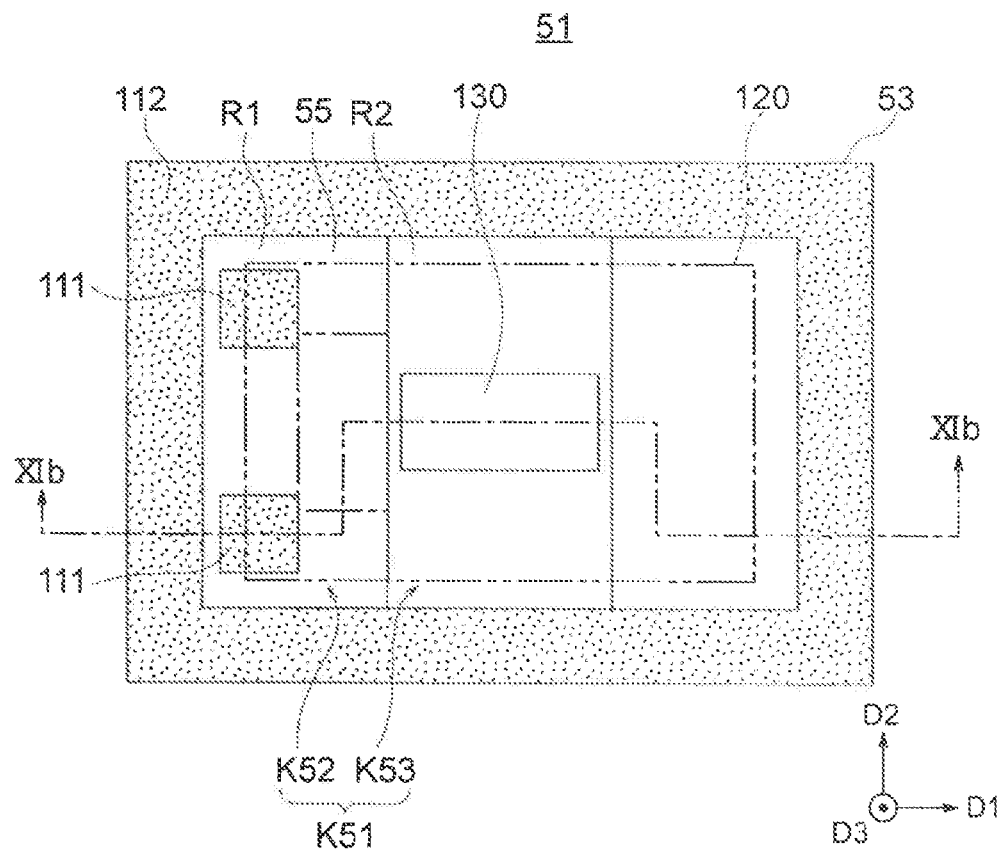
FIG. 11A is a plan view showing a portion of the crystal unit in FIG. 10.
Figure 11B:
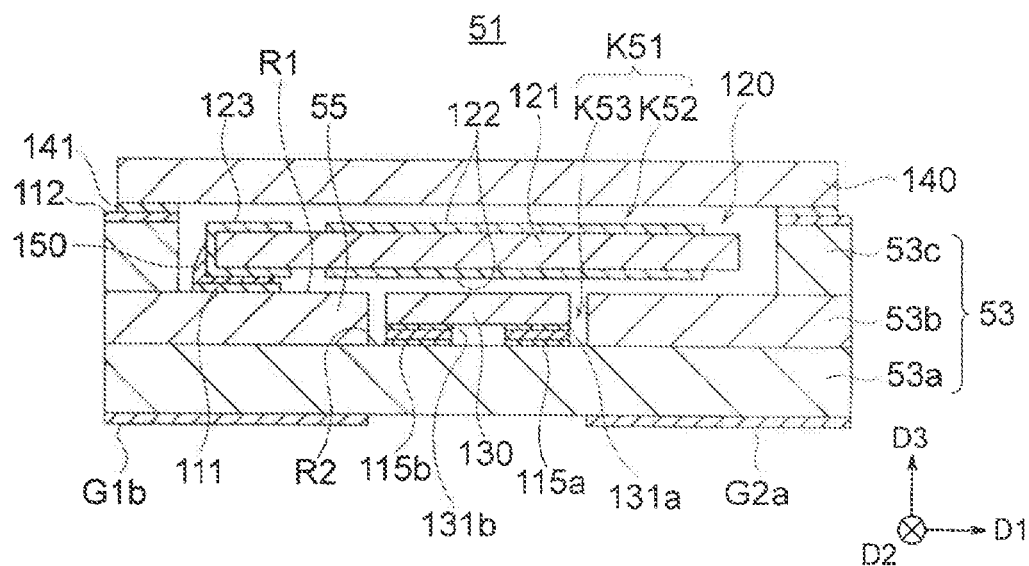
FIG. 11B is a cross-sectional view taken along a XIb-XIb line in FIG. 11A.

FIG. 10 is a plan view showing the configuration of a principal part of a crystal unit 51 according to a second embodiment. FIG. 11A is a plan view showing an internal portion of the crystal unit 51, and FIG. 11B is a cross-sectional view taken along the XIb-XIb line in FIG. 11A.

In the second embodiment as well, in the same way as the first embodiment, the crystal unit 51 has a crystal element 120 and temperature sensor 130, and the crystal element 120 has a crystal blank 121 having crystal planes 125 to 128 which are inclined relative to the major surfaces (however, illustration omitted here).

Accordingly, the same effects as those by the first embodiment are exerted. For example, the volume of the crystal blank 121 is made smaller relative to the excitation electrodes 122, the ability of a temperature change of the crystal blank 121 to track a temperature change of the external environment is improved, and consequently possible deviation of the temperature of the crystal blank 121 and the detection temperature of the temperature sensor 130 can be reduced.

However, in contrast to the first embodiment in which the crystal element 120 and the temperature sensor 130 were accommodated in different spaces, in the second embodiment, the two are accommodated in the same space. That is, the configuration of the package is different between the two. Specifically, this is as follows The outer shape of a package 53 of the crystal unit 51 is for example a substantially rectangular parallelepiped shape. Further, a concave part K51 of the package 53 for example has an element-use concave part K52 in which the crystal element 120 is accommodated and a sensor-use concave part K53 which is opened at the bottom surface of the element-use concave part K52 and accommodates the temperature sensor 130 therein. From another viewpoint, the package 53 has a table part positioned on the bottom surface of the concave part K51. The upper surface of the table part 55 becomes a first region R1 for mounting the crystal element 120. The bottom surface of the concave part K51 (region in which the table part 55 is not arranged) becomes a second region R2 for mounting the temperature sensor 130. The two of the first region R1 and second region R2 are regions facing the lid 140 side in the inner surface of the concave part K51.

As shown in FIG. 11B, the package 53 is for example configured by two or more (three in the present embodiment) layers of a first insulation layer 53a to third insulation layer 53c. Specifically, for example, the package 53, from the lower surface side, has a first insulation layer 53a, a second insulation layer 53b having an opening configuring the sensor-use concave part K53, and a third insulation layer 53c having an opening configuring the element-use concave part K52 in that order. The bottom surface of the concave part K51 (second region R2) is configured by the upper surface of the first insulation layer 53a. The first region R1 is configured by the upper surface of the second insulation layer 53b.

The shapes of the outer edges of the first insulation layer 53a to third insulation layer 53c are for example rectangular since that the outer shape of the package 53 is a rectangular cuboid shape. The planar shapes of the sensor-use concave part K53 and element-use concave part K52 are for example rectangles positioned at the centers of the insulation layers and having four sides parallel to those of the rectangles of the outer edges of the insulation layers. Note that, although not particularly shown, in the second insulation layer 53b, the shape on the positive side of the D1 axis direction may be made the same as the third insulation layer 53c as well. That is, the portion on the positive side of the D1 axis direction having the same shape as the table part 55 need not be provided. Further, the table part 55 may be divided in the D2 axis direction corresponding to the two electrode pads 111.

The thicknesses of the insulation layers (53a to 53c) may be the same as each other or may be different from each other. In the example shown, the thickness of the second insulation layer 53b becomes larger than the thickness of the third insulation layer 53c. That is, the height from the bottom surface of the concave part K51 (second region R2) to the first region R1 is lower than the height from the first region R1 to the upper surface of the package 110 (or the lower surface of the lid 140).

Each of the insulation layers (53a to 53c) is the same as the insulation layer configuring the substrate part 110a and the like explained in the first embodiment. Each of the first insulation layer 53a to the third insulation layer 53c may be formed by using one insulation layer or may be formed by stacking a plurality of insulation layers.

The package 53 having the configuration as described above is provided with the same conductors as those in the package 110 in the first embodiment. Specifically, for example, this is as follows.

On the lower surface of the first insulation layer 53a, the first external connection-use electrode terminals G1 (G1a, G1b) and second external connection-use electrode terminals G2 (G2a, G2b) are provided. In the first region R1, a pair of electrode pads 111 for mounting the crystal element 120 are provided. In the second region R2, a pair of bonding pads 115 for mounting the temperature sensor 130 are provided. Although illustration is omitted, on the upper surface and in the internal portion of the first insulation layer 53a and on the upper surface and in the internal portion of the second insulation layer 53b, conductors for connecting the pair of electrode pads 111 and the pair of external connection-use electrode terminals G1 are provided. Further, although illustration is omitted, on the upper surface and in the internal portion of the first insulation layer 53a, conductors for connecting the pair of bonding pads 115 and the pair of second external connection-use electrode terminals G2 are provided. On the upper surface of the package 53, a sealing-use conductor pattern 112 is provided.

As described above, in the second embodiment, the package 53 has the concave part K51. The lid 140 air-tightly seals the interior of the concave part K51 by closing the opening of the concave part K51. The crystal element 120 is accommodated in the concave part K51 and mounted in the first region R1 facing the lid 140 side in the inner surface of the concave part K51. The temperature sensor 130 is accommodated in the concave part K51 and is mounted in the second region R2 facing the lid 140 side in the inner surface of the concave part K51 and detects the temperature on the surface on the second region R2 side (major surface 132a).

That is, the crystal element 120 is arranged in the same space as that for the temperature sensor 130 and is mounted together with it in the bottom portion of the concave part K51. Accordingly, for example, the same situation as the situation of the temperature of the bottom portion of the concave part K51 exerting an influence upon the temperature of the crystal element 120 can be reproduced in the temperature sensor 130. As a result, for example, the already explained effect according to the detection of the temperature on the major surface 132a by the temperature sensor 130 is improved.

(Modifications)

Below, various modifications will be explained. The modifications may be applied to either of the first or second embodiment. However, for convenience, notations in the first embodiment will be used with a higher priority.

(Modification According to Position of Arrangement of Temperature Sensor)

Figure 12A:
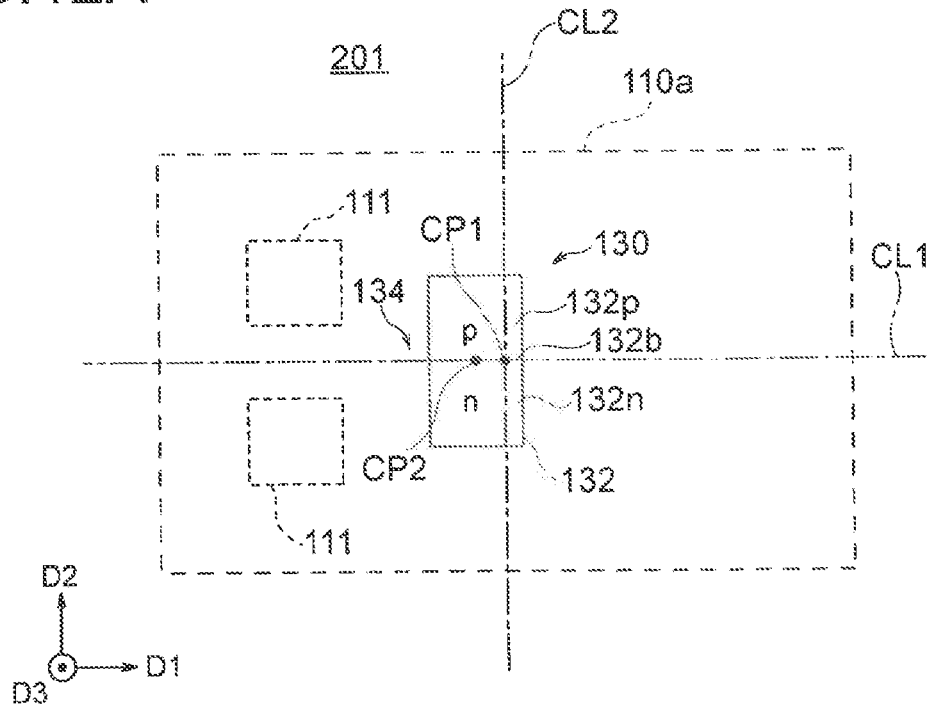
FIG. 12A, FIG. 12B, and FIG. 12C are schematic views for explaining various modifications.

FIG. 12A is a plan view showing the configuration of a principal part of a crystal unit 201 according to a modification.

In the crystal unit 201, basically, only the position of the temperature sensor 130 is different from that in the embodiments. Note that, along with the difference of the position of the temperature sensor 130, the arrangement of the bonding pads 115 and the shape of the sensor-use wiring pattern 116 are also different from the embodiments. Further, the position and/or shape of the second concave part K2 may be different from that in the embodiments. However, these configurations can be deduced to an extent whereby working is possible from the explanation of the embodiments, therefore explanations thereof will be omitted.

The arrangement of the temperature sensor 130 is first different in orientation by 90° from the embodiments when viewed on a plane. That is, in contrast to the crystal element 120 being supported on only one end side of the first direction (D1 axis direction) parallel to the upper surface of the substrate part 110a, when viewing the semiconductor substrate 132 on a plane, at least a portion of the p-type region 132p and n-type region 132n (all in the example shown) is positioned closer to one side or the other side of the first direction than the support position of the crystal element 120 (electrode pads 111) and extends along the first direction.

In the explanation of the embodiments, it was stated that when a temperature change of the substrate part 110a advances from the electrode pads 111 side, if the temperature change reaches the boundary portion 132b, a sudden change of detection temperature would be liable to occur. On the other hand, in the crystal unit 201 in the present modification, the boundary portion 132b is formed along the D1 axis. Therefore, along with the advance of a temperature change in the D1 axis direction, the change of the forward characteristic gradually occurs, therefore a sudden change of detection temperature is eased.

Note that, when the boundary portion 132b extends along the first direction, the boundary portion 132b does not always have to be parallel to the first direction. For example, the boundary portion 132b may be inclined in the first direction at an angle not more than 10° as well.

Further, in the present modification, when viewing the substrate part 110a on a plane, the center CP2 (center of gravity of figure) of the temperature sensor 130 is positioned closer to the electrode pads 111 side of the D1 axis direction than the center CP1 of the substrate part 110a (center of gravity of figure, the cross point of the center line CL1 and the center line CL2).

As understood also from the above explanation, when the temperature of the external environment changes, the temperature of the crystal element 120 is easily influenced by the temperature of the electrode pads 111. Accordingly, by the temperature sensor 130 being positioned on the electrode pad 111 side as described above, it becomes easier to make the detection temperature follow the temperature on the electrode pad 111 side. There is a time delay from occurrence of a temperature change on the electrode pads 111 up to the transfer of that temperature change to the crystal blank 121. The detection temperature can be made to approach the temperature of the crystal blank 121 depending on the duration of the time delay and certain sensitivity of the temperature sensor 130.

Note that, the configuration making the temperature sensor 130 closer to the electrode pad 111 side may also be applied to a case where the direction of arrangement of the p-type region 132p and n-type region 132n is the D1 axis direction or further another direction as in the embodiments.

(Modification According to Configuration of Temperature Sensor)

Below, a modification according to the configuration of the temperature sensor will be shown. Note that, for convenience, the orientations of the temperature sensor relative to the D1 axis and D2 axis are made the same as those in the embodiments. However, they may be made the same as the modification in FIG. 12A as well.

Figure 12B:
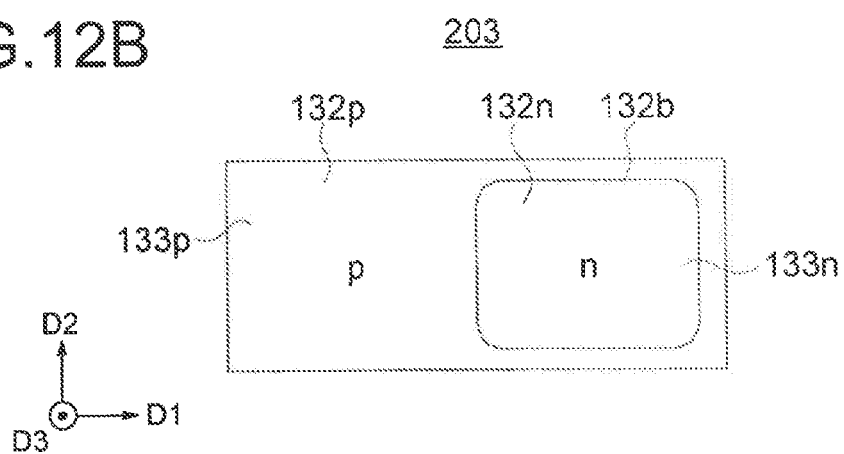

As already explained, the positional relationships of above/below and/or left/right between the n-type semiconductor and the p-type semiconductor in the embodiments may be reversed as well. The temperature sensor 203 according to the modification shown in FIG. 12B is modified in this way. That is, in this modification, the n-type layer 133n is provided in a partial region of the p-type layer 133p. Note that, in various modifications which will be explained below as well, the positional relationships of above/below and/or left/right between the n-type semiconductor and the p-type semiconductor may be reversed.

Further, in the modification in FIG. 12B, when viewed on a plane, the boundary portion 132b of the n-type region 132n and the p-type region 132p is formed so as to surround the n-type region 132n. Note that, in this boundary portion 132b, the portions along the D1 axis direction can exert an effect of for example suppressing a sudden change of detection temperature when the temperature change of the substrate part 110a advances in the D1 axis direction in the same way as the boundary portion 132b in FIG. 12A.

However, the above effect is larger in the case where, as shown in the modification in FIG. 12A, the portion in the pn junction surface, which has a larger influence upon the function as the diode, extends along the D1 axis. As such an aspect, for example the following aspect can be mentioned:

As shown in FIG. 12A, when viewing the semiconductor substrate 132 on a plane, relative to the portion (boundary portion 132b) in the pn junction surface which extends along the first direction (D1 axis direction) and/or relative to the center line CL1 of the semiconductor substrate 132 which is parallel to the first direction (D1 axis direction), 80% or more of the p-type region 132p is positioned on one side of the direction (D2 axis direction) perpendicular to the first direction and 80% or more of the n-type region 132n is positioned on the other side of the direction (D2 axis direction) perpendicular to the first direction.

Figure 12C:
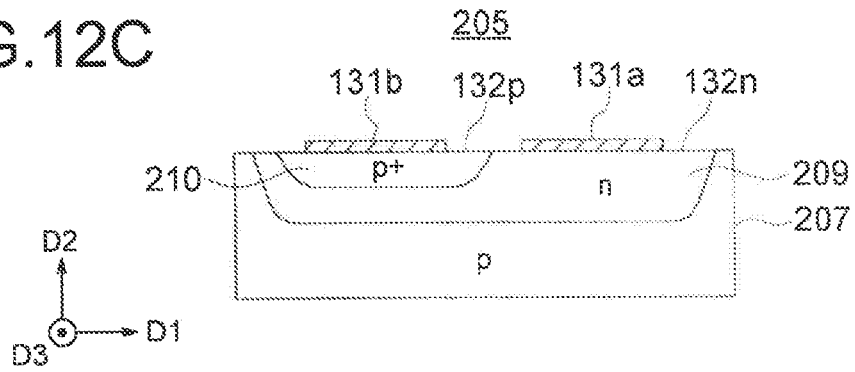

The temperature sensor 205 according to the modification in FIG. 12C has a so-called "well". In the example shown, an n-type well 209 is formed in the p-type semiconductor substrate 207, and a p-type layer 210 is formed in the well 209. Note that, the well 209 becomes one example of the first layer, and the layer 210 becomes one example of the second layer. The modification providing such a well may be applied to any of the embodiments and other modifications as well.

Figure 13A:
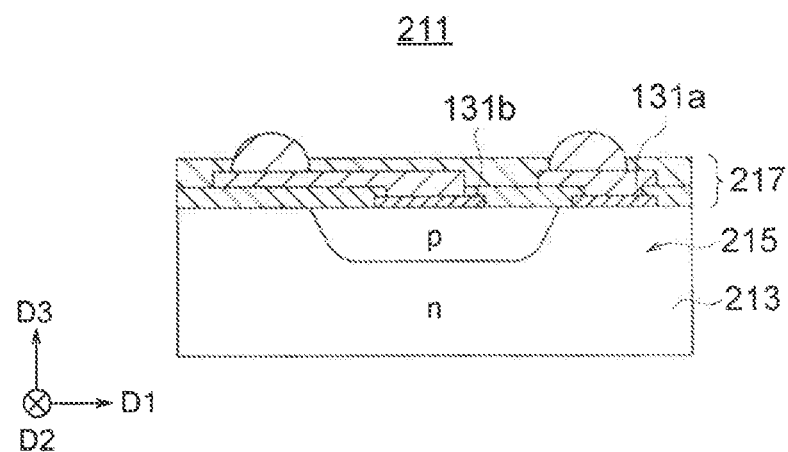
FIG. 13A is a cross-sectional view of a temperature sensor according to a modification.
Figure 13B:
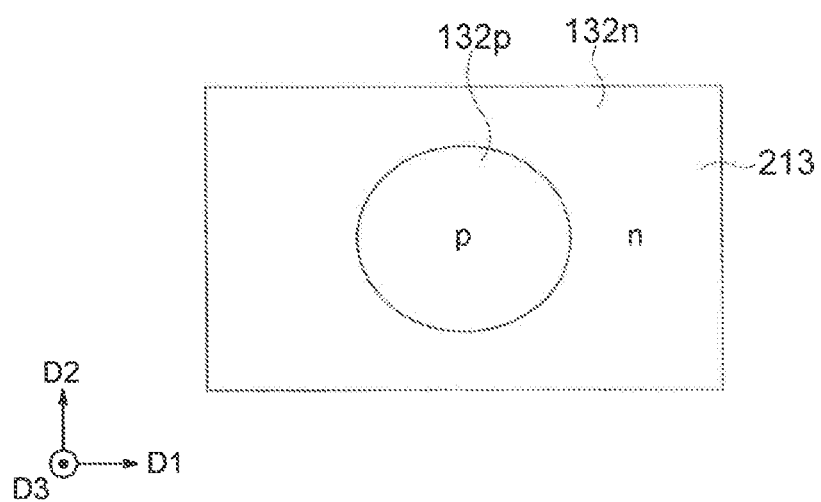
FIG. 13B is a plan view showing the configuration of a semiconductor substrate of the temperature sensor in FIG. 13A.

FIG. 13A is a cross-sectional view of a temperature sensor 211 according to a modification. FIG. 13B is a plan view showing the configuration of a semiconductor substrate of the temperature sensor 211.

The temperature sensor 211, in the same way as the embodiments, has a semiconductor substrate 213 including a diode 215 and is configured so that the semiconductor substrate 213 is surface-mounted on the substrate part 110a. However, the temperature sensor 211 is configured not as a bare chip, but as a so-called WLP type chip.

That is, the temperature sensor 211 has a re-wiring layer 217 on the semiconductor substrate 213, an anode terminal 131b, and a cathode terminal 131a. The re-wiring layer 217 is for example configured by stacking suitable numbers of insulation layers and conductor layers although notations are not particularly attached. The terminals are exposed in the uppermost part. On the terminals, solder bumps and the like may be provided as well.

If the re-wiring layer 217 is provided in this way, for example, the degree of freedom of the positions of arrangement of the anode terminal 131b and cathode terminal 131a in the temperature sensor 130 (consequently the positions of arrangement of the n-type region 132n and p-type region 132p), the positions of arrangement inside the temperature sensor 130 of the terminals joined to the substrate part 110a, and the design of these positional relationships is improved.

Accordingly, for example, the two ends of the semiconductor substrate 213 may be joined with respect to the substrate part 110a while positioning the anode terminal 131b (p-type region 132p) at the center of the semiconductor substrate 132 (n-type region 132n).

The technique according to the present disclosure is not limited to the above embodiments and modifications and may be executed in various aspects.

The crystal blank is not limited to an AT cut plate. For example, it may be a BT cut plate as well. Further, the crystal blank is not limited to a flat plate shape and may be a mesa-type in which the center part is thicker than the outer periphery as well. In the AT cut plate, the crystal planes shown in the embodiments are single examples. For example, according to presence/absence of etching for forming the mesa-type and/or etching time, other crystal planes appear.

The temperature sensor is not limited to one detecting the temperature on the surface. For example, the temperature sensor may be a sensor in which the p-type layer and n-type layer are arranged stacked and an anode terminal and a cathode terminal are provided on the two sides of the stacking direction as well. It may be a sensor which includes a plurality of resistors (thermistors) arranged stacked and utilizes the change of the resistance with respect to a temperature change as well.

The temperature sensor detecting the temperature on the surface is not limited to one having a diode. Further, the temperature sensor having a sensor substrate mounted on the substrate part of the package and a temperature measurement part positioned on the substrate part side of the sensor substrate (bare chip, WLP type chip, or these kinds of chips) is not limited to one having a diode. For example, the temperature sensor may be a sensor which has a suitable insulation substrate and a resistor arranged on the major surface on the substrate part side of the insulation substrate and utilizes a characteristic change of the resistor with respect to a temperature change as well.

In the bare chip, WLP type chip, or these kinds of chips, on the sensor substrate, an insulation layer and/or conductor layer may be provided on the side surface and back surface (side opposite to the temperature measurement part) as well. In other words, in the semiconductor substrate, a portion does not always have to be exposed either.

In the case where the temperature sensor is one including a diode, the temperature sensor may be a packaged one as well. In this case as well, for example, it is possible to realize a configuration in which the temperature may be detected on the surface by arranging the semiconductor substrate closer to the substrate part side in the sealing member or arranging the semiconductor substrate in the sealing member so that the surface for forming the diode faces the substrate part side or raising the thermal conductivity of the portion in the sealing member, which is positioned between the semiconductor substrate and the substrate part. Further, in the embodiments, the temperature sensor included only one diode. Note that, the temperature sensor may include a plurality of diodes which are connected to each other as well.

As the diode, one having a pn junction was exemplified. However, the diode may be one having a bonding surface (boundary portion, boundary surface) other than a pn junction like a PIN diode as well. Note that, in the PIN diode, the boundary portion of the p-type region and the n-type region (boundary surface of the first layer and the second layer) is an i-type region (i-type layer).

The diode may have a configuration which can function as another element as well. For example, in the temperature sensor, by including a transistor and short-circuiting the base and the collector by wiring of the temperature sensor or wiring of the package or the like, a portion of the transistor may function as a diode as well.

The diode detecting the temperature of the surface of the temperature sensor is not limited to a planar structure in which the p-type region and n-type region are formed on a major surface of the semiconductor substrate, but may have a structure in which the p-type layer and the n-type layer are stacked and a current flows in the stacking direction of these as well. Also in this case, it can be said that the temperature is detected on the surface on the substrate part side so far as the diode is provided biased on the surface on the substrate part side in the temperature sensor.

Further, the diode may have suitable layer and the like other than those shown in the embodiments. For example, it may suitably have an oxide film (for example $SiO_2$ film) positioned on the semiconductor substrate, gate ring, and passivation film etc. as well.

Priority is claimed on Japanese application No. 2017-192543, filed on Oct. 2, 2017, the contents of which is incorporated herein by reference.

REFERENCE SIGNS LIST

1 . . . crystal unit, 110 . . . package, 120 . . . crystal element, 122 . . . excitation electrode, 130 . . . temperature sensor, and 125 to 128 . . . crystal planes.

The invention claimed is:
1. A crystal unit comprising:
a package;
a crystal element which comprises a crystal blank and a pair of excitation electrodes on a pair of major surfaces of the crystal blank and is air-tightly sealed in the package; and
a temperature sensor mounted on the package, wherein
the crystal blank comprises a first crystal plane inclined relative to the major surfaces in a portion of a side surface and a second crystal plane inclined relative to the major surfaces and intersecting the first crystal plane in another portion of the side surface
the major surfaces of the crystal blank comprises shapes whereby, when viewed on a plane, the lengths of a predetermined long direction are longer than the lengths of a short direction perpendicular to the long direction,
the crystal blank comprises a pair of side surfaces which extend along the long direction,
the pair of side surfaces comprises a plurality of crystal planes inclined relative to the major surfaces,
the crystal element is supported on the package only on one end side of the longitudinal direction,
in a planar view of the crystal blank, the temperature sensor is located at a position that falls within the crystal blank and does not overlap the pair of side surfaces, and
in a planar view of the crystal blank, the center of the temperature sensor is located closer to one end side of the long direction than the center of the crystal blank.
2. The crystal unit according to claim 1, wherein, in a planar view of the crystal blank, a center line parallel to the long direction of the region of the pair of major surfaces in which they overlap each other and a center line parallel to the long direction of the temperature sensor coincide.
3. The crystal unit according to claim 1, wherein the temperature sensor comprises a shape that is longer in the long direction and comprises a pair of terminals on the two sides of the long direction.
4. The crystal unit according to claim 1, wherein the temperature sensor comprises a shape that is longer in the short direction and comprises a pair of terminals on the two sides of the short direction.
5. The crystal unit according to claim 1, wherein the temperature sensor is mounted in a predetermined region in the surface of the package and detects the temperature on the surface on the predetermined region side.
6. The crystal unit according to claim 1, wherein the temperature sensor comprising
a sensor substrate facing a predetermined region in the surface of the package and surface-mounted on the predetermined region, and
a temperature measurement part which is located on the predetermined region side of the sensor substrate and changes in electrical characteristics in accordance with the temperature.

7. The crystal unit according to claim 1, wherein the temperature sensor comprising a semiconductor substrate facing a predetermined region in the surface of the package and surface-mounted on the predetermined region, and a major surface on the predetermined region side of the semiconductor substrate comprises a p-type region and n-type region configuring a diode.

8. The crystal unit according to claim 1, wherein the first crystal plane and the second crystal plane are planes appearing due to wet etching.

9. A crystal unit comprising:

a package;

a crystal element which comprises a crystal blank and a pair of excitation electrodes on a pair of major surfaces of the crystal blank and is air-tightly sealed in the package; and a temperature sensor mounted on the package, wherein the crystal blank comprises a first crystal plane inclined relative to the major surfaces in a portion of a side surface and a second crystal plane inclined relative to the major surfaces and intersecting the first crystal plane in another portion of the side surface, and wherein the first crystal plane and the second crystal plane are asymmetric with respect to a plane being parallel to the major surfaces and located at a center between the major surfaces.

10. A crystal unit comprising:

a package;

a crystal element which comprises a crystal blank and a pair of excitation electrodes on a pair of major surfaces of the crystal blank and is air-tightly sealed in the package; and a temperature sensor mounted on the package, wherein the crystal blank comprises a first crystal plane inclined relative to the major surfaces in a portion of a side surface and a second crystal plane inclined relative to the major surfaces and intersecting the first crystal plane in another portion of the side surface, the crystal blank comprises a pair of side surfaces facing opposite to each other, one of the pair of side surfaces is the side surface comprising the first crystal plane and the second crystal plane, and the pair of side surfaces are asymmetric with respect to a plane being perpendicular to the major surfaces and located at a center between the pair of side surfaces.

* * * * *